United States Patent
Hwang

(10) Patent No.: US 8,824,195 B2
(45) Date of Patent: Sep. 2, 2014

(54) METHODS OF FORMING PHASE-CHANGE MEMORY DEVICES AND DEVICES SO FORMED

(71) Applicant: Samsung Electronics Co., Ltd., Suwon-si (KR)

(72) Inventor: Youngnam Hwang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/044,581

(22) Filed: Oct. 2, 2013

(65) Prior Publication Data

US 2014/0027704 A1 Jan. 30, 2014

Related U.S. Application Data

(62) Division of application No. 13/069,636, filed on Mar. 23, 2011, now Pat. No. 8,551,840.

(30) Foreign Application Priority Data

Mar. 23, 2010 (KR) .................. 10-2010-0025910

(51) Int. Cl.
G11C 11/00 (2006.01)
H01L 45/00 (2006.01)
H01L 27/24 (2006.01)

(52) U.S. Cl.
CPC .......... *H01L 45/1253* (2013.01); *H01L 45/06* (2013.01); *H01L 45/1675* (2013.01); *H01L 45/144* (2013.01); *H01L 45/126* (2013.01); *H01L 45/1233* (2013.01); *H01L 27/2409* (2013.01)
USPC ....................................... 365/153

(58) Field of Classification Search
CPC .................................. G11C 14/0045
See application file for complete search history.

(56) References Cited

U.S. PATENT DOCUMENTS 7,629,198 B2 * 12/2009 Kumar et al. ............ 438/104
2005/0282341 A1 * 12/2005 Park et al. .................. 438/283

(Continued)

FOREIGN PATENT DOCUMENTS

| KR | 1020080111206 A | 12/2008 |
|----|----|----|
| KR | 1020090070304 A | 7/2009 |
| KR | 1020090096037 A | 9/2009 |

OTHER PUBLICATIONS

C. Detavernier et al. "CoSi2 formation in the presence of Ti, Ta or W" Thin Solid Films 468 (2004) pp. 174-182.

(Continued)

*Primary Examiner* — Charles Garber
*Assistant Examiner* — Andre' C Stevenson
(74) *Attorney, Agent, or Firm* — Myers Bigel Sibley & Sajovec, P.A.

(57) ABSTRACT

Phase-change memory devices are provided. A phase-change memory device may include a substrate and a conductive region on the substrate. Moreover, the phase-change memory device may include a lower electrode on the conductive region. The lower electrode may include a metal silicide layer on the conductive region, and a metal silicon nitride layer including a resistivity of about 10 to about 100 times that of the metal silicide layer. Moreover, the lower electrode may include a metal oxide layer between the metal silicon nitride layer and the metal silicide layer. The metal oxide layer may include a resistivity that is greater than that of the metal silicide layer and less than the resistivity of the metal silicon nitride layer. The phase-change memory device may also include a phase-change layer and an upper electrode on the lower electrode.

13 Claims, 39 Drawing Sheets

(56) References Cited

U.S. PATENT DOCUMENTS

| | | | |
|---|---|---|---|
| 2006/0091492 A1 | 5/2006 | Lee et al. | 257/467 |
| 2007/0246743 A1* | 10/2007 | Cho et al. | 257/202 |
| 2008/0175032 A1 | 7/2008 | Tanaka et al. | 365/51 |
| 2009/0011566 A1 | 1/2009 | Okada et al. | 438/308 |
| 2009/0095951 A1 | 4/2009 | Kostylev et al. | 257/4 |
| 2009/0302302 A1 | 12/2009 | Heo et al. | 257/4 |

OTHER PUBLICATIONS

Dong Kyun Sohn et al. "Formation of CoTi barrier and increased thermal stability of CoSi2 film in Ti capped Co/Si(100) system", Applied Physics Letters, vol. 73, No, 16, Oct. 19, 1998, pp. 2302-2304.

"Influence of Oxygen on the Reactive Phase Formation of Titanium Disilicide Thin Films" Science-36, pp. 72-73 (www.igcar.ernet.in/benchmark/science/36-sci.pdf), Dec. 24 , 1990.

H.J. Peng et al, "Effects of first rapid thermal annealing temperature on Co silicide formation", Solid-State Electronics 47 (2003) pp. 1249-1253.

C. Detavernier et al. "Influence of Ti on CoSi2 nucleation" Applied Physics Letters, vol. 77, No. 20, Nov. 13, 2000, pp. 3170-3172.

* cited by examiner

US 8,824,195 B2

METHODS OF FORMING PHASE-CHANGE MEMORY DEVICES AND DEVICES SO FORMED

CROSS-REFERENCE TO RELATED APPLICATIONS

This U.S. non-provisional patent application is a divisional of and claims priority from U.S. patent application Ser. No. 13/069,636, filed Mar. 23, 2011, which claims priority under 35 U.S.C. §119 to Korean Patent Application No. 10-2010-0025910, filed on Mar. 23, 2010, the entire contents of which are hereby incorporated by reference.

BACKGROUND OF THE INVENTION

The present disclosure herein relates to the field of semiconductors, and more particularly, to methods of forming phase-change memory devices and related devices.

Phase-change memory devices may store data using changes in resistance caused by a phase transition of a chalcogenide compound in a phase-change layer. For example, the resistance of the phase-change layer can be different in an amorphous state than in a crystalline state. The phase-change layer can change phase responsive to a temperature of a lower electrode. The lower electrode may include a high resistivity metal layer.

SUMMARY OF THE INVENTION

Embodiments according to the inventive concept can provide methods of forming phase change memory devices and devices so formed. Pursuant to these embodiments according to the inventive concept, a method of forming can be provided by forming a metal silicide layer that includes a diffusion metal on a substrate. A native oxide layer can be formed on the metal silicide layer and forming a metal oxide layer by reacting the native oxide layer with the diffusion metal. A phase-change layer and an upper electrode can be formed on the metal oxide layer.

In some embodiments according to the inventive concept, the metal silicide layer can be formed by forming a first metal layer that contains a silicide reactive metal and a second metal layer that contains the diffusion metal on the substrate. A first annealing can be performed on the first metal layer and the second metal layer. In some embodiments according to the inventive concept, the silicide reactive metal can be at least one of cobalt and nickel. In some embodiments according to the inventive concept, the metal silicide layer can be formed by removing the first metal layer and the second metal layer remaining on the metal silicide layer.

In some embodiments according to the inventive concept, the metal silicide layer can be formed by forming a protective metal layer on the first metal layer and the second metal layer. In some embodiments according to the inventive concept, the diffusion metal can be at least one of titanium, tantalum, tungsten, molybdenum, vanadium, hafnium and zirconium. In some embodiments according to the inventive concept, the metal oxide layer can be formed by performing a second annealing on the native oxide layer to replace an insulating constituent of the native oxide layer with the diffusion metal.

In some embodiments according to the inventive concept, the metal oxide layer can be at least one of a titanium oxide layer, a tantalum oxide layer, a tungsten oxide layer, a molybdenum oxide layer, a vanadium oxide layer, a hafnium oxide layer and a zirconium oxide layer. In some embodiments according to the inventive concept, the metal oxide layer can be formed by forming a resistive metal layer on the substrate before or after the second annealing. In some embodiments according to the inventive concept, the resistive metal layer can be a metal silicon nitride layer. In some embodiments according to the inventive concept, the metal silicon nitride layer is formed by metal-organic chemical vapor deposition. In some embodiments according to the inventive concept, the metal silicon nitride layer comprises at least one of a titanium silicon nitride layer, a tantalum silicon nitride layer, a zirconium silicon nitride layer and a tungsten silicon nitride layer.

In some embodiments according to the inventive concept, a method of forming a phase-change memory device can be provided by forming a diode on a substrate including an upper conductive layer and forming a first metal layer including a diffusion metal on the upper conductive layer. A metal silicide layer can be formed on the upper conductive layer including the diffusion metal and a metal oxide layer can be from the metal silicide layer. A metal silicon nitride layer can be formed on the metal oxide layer and a phase-change layer and an upper electrode can be formed on the lower electrode.

In some embodiments according to the inventive concept, a second metal layer can be formed above the first metal layer, where the second metal layer can include a metal constituent included in the metal silicide layer. In some embodiments according to the inventive concept, a second metal layer can be formed beneath the first metal layer, where the second metal layer can include a metal constituent included in the metal silicide layer. In some embodiments according to the inventive concept, the metal oxide layer can be formed by forming a native oxide layer on the metal silicide layer and replacing an oxide constituent in the native oxide layer with the diffusion metal.

In some embodiments according to the inventive concept, a phase-change memory device can include a substrate and a conductive region on the substrate with a lower electrode on the conductive region, where the lower electrode can include a metal silicide layer on the conductive region and a metal silicon nitride layer having a resistivity of about 10 to about 100 times that of the metal silicide layer. A metal oxide layer can be located between the metal silicon nitride layer and the metal silicide layer, the metal oxide layer comprising a resistivity that is greater than that of the metal silicide layer and less than the resistivity of the metal silicon nitride layer. A phase-change layer and an upper electrode can be located on the lower electrode.

In some embodiments according to the inventive concept, a metal constituent of the metal oxide layer can be a diffusion metal constituent of the metal silicide layer diffused into the metal oxide layer. In some embodiments according to the inventive concept, the metal oxide layer can be at least one of a titanium oxide layer, a tantalum oxide layer, a tungsten oxide layer and a zirconium oxide layer.

DETAILED DESCRIPTION

Figure 1:
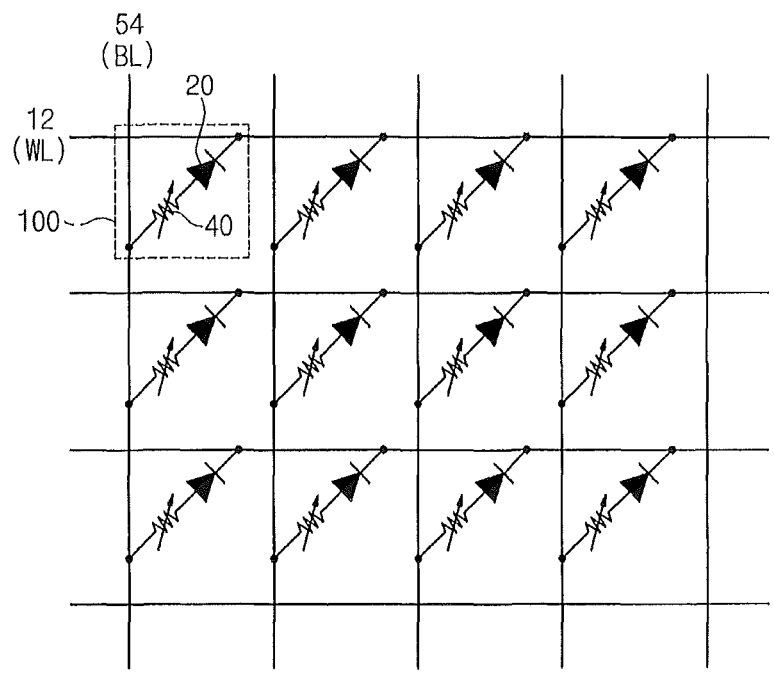
FIG. 1 is a circuit diagram schematically illustrating a memory device according to embodiments of the inventive concept.

Hereinafter, preferred embodiments of the inventive concept will be described in more detail with reference to the accompanying drawings. Advantages and features of the inventive concept, and implementation methods thereof will be clarified through following embodiments described with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art, and the inventive concept is only defined by scopes of claims. Like reference numerals refer to like elements throughout.

While specific terms were used in the specification, they were not used to limit the inventive concept, but merely used to explain the exemplary embodiments. In the inventive concept, the terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components. Since preferred embodiments are provided below, the order of the reference numerals given in the description is not limited thereto. Further, in the specification, it will also be understood that when a layer (or film) is referred to as being 'on' another layer or substrate, it can be directly on the other layer or substrate, or intervening layers may also be present.

Additionally, the embodiments in the detailed description will be described with sectional views and/or plan views as ideal exemplary views of the inventive concept. In the drawings, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device region. Thus, this should not be construed as limited to the scope of the inventive concept.

Figure 2:
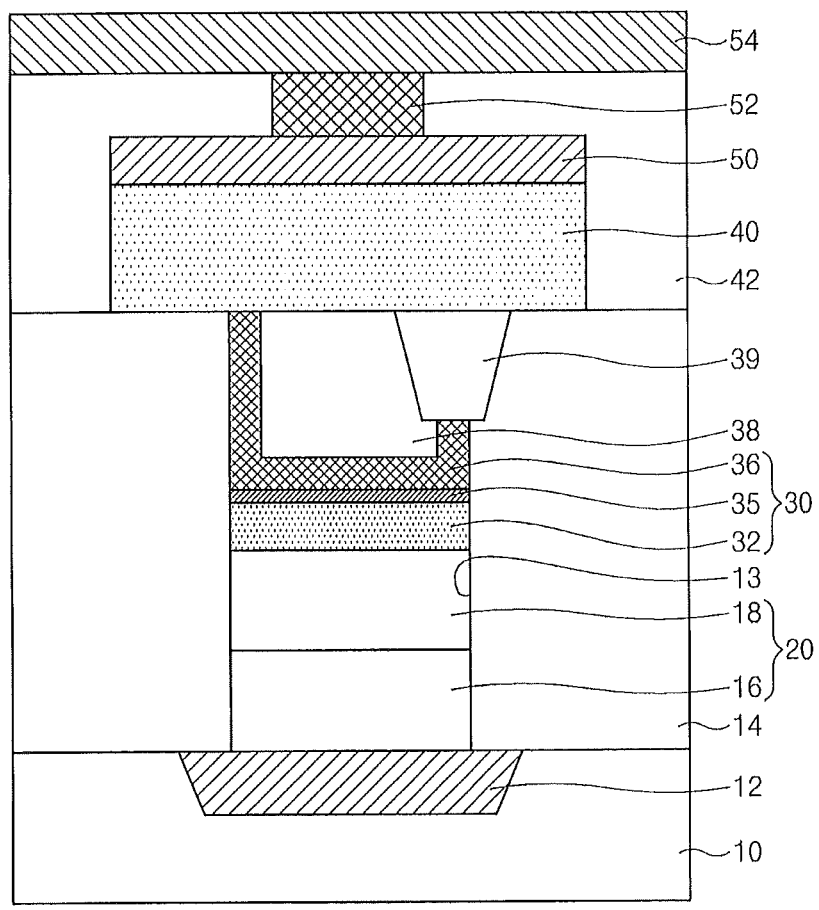
FIG. 2 is a cross-sectional view illustrating the memory device in FIG. 1.

FIG. 1 is a circuit diagram schematically illustrating a memory device according to embodiments of the inventive concept, and FIG. 2 is a cross-sectional view illustrating the memory device in FIG. 1.

Referring to FIGS. 1 and 2, the memory device according to embodiments of the inventive concept may include a lower electrode 30 having a metal oxide layer 35 disposed between a metal silicide layer 32 and a resistive metal layer 36, below a phase-change layer 40. Herein, the resistive metal layer 36 may include a high-resistivity metal to easily heat the phase-change layer 40 of memory cells 100 selected by a bit line 54 and a word line 12 to about the phase transition temperature. The metal silicide layer 32 may provide an ohmic contact with a diode 20. The metal oxide layer 35 may increase conductivity between the metal silicide layer 32 and resistive metal layer 36.

The memory device according to the embodiments of the inventive concept includes the metal oxide layer 35 with sufficient conductivity between the metal silicide layer 32 and resistive metal layer 36, thus enabling an increase in the reliability of electrical conduction of the lower electrode 30.

The bit line 54 and word line 12 may be provided in plural. A plurality of memory cells 100 may be arranged in a matrix by the bit lines 54 and word lines 12 which cross each other. The memory cells 100 may include the phase-change layer 40 and the diode 20 as a selective active device. The phase-change layer 40 may include a chalcogenide compound which can change phase between the crystalline state and amorphous state depending on a temperature of the chalcogenide compound. The phase-change layer 40 may have variable resistances which differ in the amorphous and crystalline states, respectively. The state of the phase-change layer 40 may be determined according to the amount of current supplied through the word line 12. The phase-change layer 40 may be disposed between an upper electrode 50 and the lower electrode 30. The upper electrode 50 may be connected electrically to the bit line 54 on an interlayer dielectric 42 through a contact plug 52. The lower electrode 30 may be connected to the word line 12 by the diode 20.

The diode 20 may include a silicon PN junction structure. For example, the diode 20 may include a first conductive impurity layer 16 doped with a first conductive impurity, and a second conductive impurity layer 18 doped with a second conductive impurity having a conductivity type opposite to that of the first conductive impurity. For example, the first conductive impurity may include n-type donors such as phosphor and arsenic. The second conductive impurity may include p-type acceptors such as boron and gallium. The diode 20 may be replaced by active devices such as a metal-oxide-semiconductor (MOS) transistor or a bipolar transistor. The diode 20 and lower electrode 30 layer may be disposed in a trench 13 of a mold insulation layer 14 on the substrate 10. A gap-fill insulation layer 38 and trimming insulation layer 39 may be disposed on the lower electrode 30 in the trench 13.

The lower electrode 30 may generate heat by the current applied from the word line 12 and diode 20. As described above, the lower electrode 30 may include the metal silicide layer 32, the metal oxide layer 35 and the resistive metal layer 36, which are stacked between the phase-change layer 40 and diode 20. The metal silicide layer 32 may be in ohmic contact with the second conductive impurity layer 18 of the diode 20. The metal silicide layer 32 may include cobalt silicide or nickel silicide.

The resistive metal layer 36 may become a heater layer heating the phase-change layer 40. The resistive metal layer 36 may include a metal silicon nitride layer having the resistivity of about 10 to about 100 times that of the metal silicide layer 32. For example, the metal silicon nitride layer may include a titanium silicon nitride layer, a tantalum silicon nitride layer, a zirconium silicon nitride layer and a tungsten silicon nitride layer.

The metal oxide layer 35 may buffer a resistance difference between the resistive metal layer 36 and metal silicide layer 32. The metal oxide layer 35 may have a higher resistance than the metal silicide layer 32 and may have a lower resistance than the resistive metal layer 36. For example, the metal oxide layer 35 may have the resistivity in the range of about $10^{-3}$ Ωcm to about $10^{10}$ Ωcm. The metal oxide layer 35 may include at least one of a titanium oxide layer, a tantalum oxide layer, a tungsten oxide layer, a molybdenum oxide layer, a vanadium oxide layer, a hafnium oxide layer and a zirconium oxide layer.

Therefore, the memory device according to an embodiment of the inventive concept can include the metal oxide layer 35 between the metal silicide layer 32 and resistive metal layer 36, thereby making it possible to increase the reliability of the lower electrode 30.

FIGS. 3 through 20 are cross-sectional views illustrating methods of forming the memory device according to an embodiment of the inventive concept.

Figure 3:
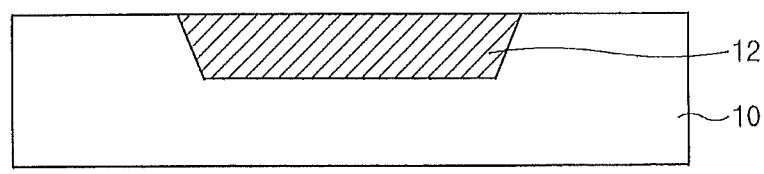
FIGS. 3 through 20 are cross-sectional views illustrating methods of forming memory device according to an embodiment of the inventive concept.

Referring to FIG. 3, a word line 12 is formed on a substrate 10. Herein, the substrate 10 may include crystalline silicon, and the word line 12 may include a conductive region in which the conductive impurity is provided by implanting ions into the substrate 10 of crystalline silicon. The conductive region may include at least one of a conductive impurity region, a contact pad, a contact plug, a conductive metal pattern and a gate electrode formed on the substrate 10. Although not shown, the conductive region may be insulated by a device isolation layer or interlayer dielectric 42 on the substrate 10.

Figure 4:
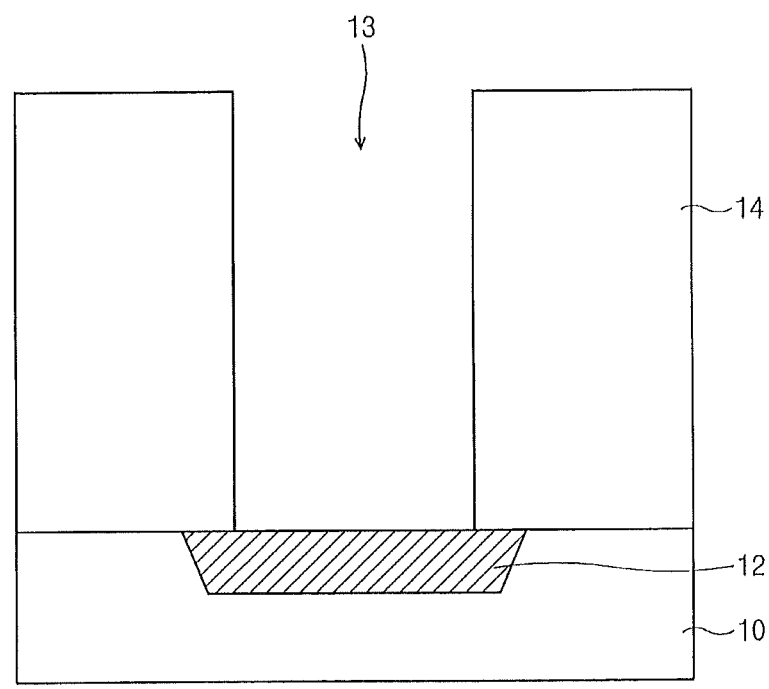

Referring to FIG. 4, a mold insulation layer 14 having a trench 13 which exposes the word line 12 is formed on the substrate 10. The mold insulation layer 14 may include a silicon oxide layer formed by at least one method of USG (Undoped Silicate Glass), BPSG (Boron-Phosphor Silicate Glass), PSG (Phosphor Silicate Glass), BSG (Boron Silicate Glass), SOG (Spin On Glass), TEOS (Tetraethylorthosilicate), PE-TEOS (Plasma Enhanced-Tetraethylorthosilicate), and HDP-CVD (High Density Plasma-Chemical Vapor Deposition). The trench 13 may be formed by a photolithography process. For example, the photolithography process may include a photo process of forming a photoresist pattern exposing the mold insulation layer 14 above the word line 12, and an etching process of removing the mold insulation layer 14 by using the photoresist pattern as an etching mask.

Figure 5:
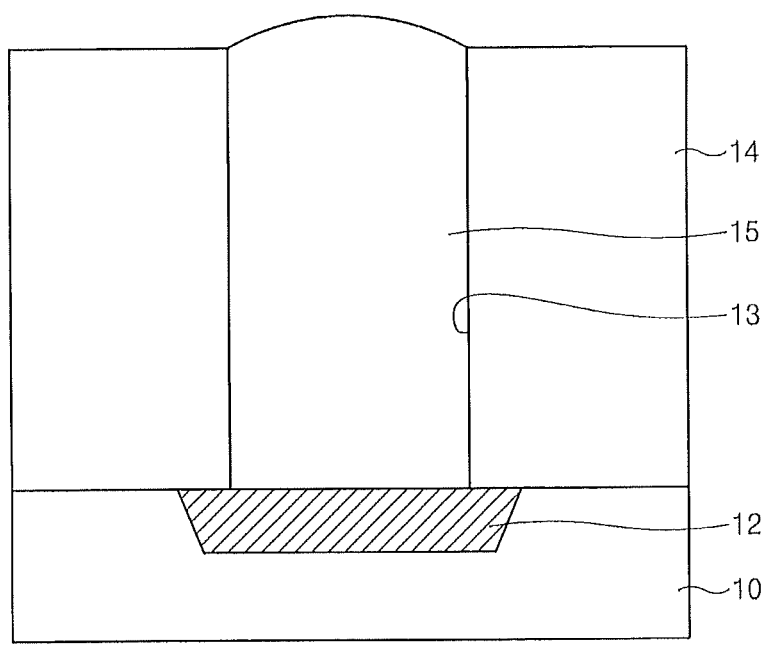

Referring to FIG. 5, a filler layer 15 is formed in the trench 13. The filler layer 15 may include the same crystalline silicon as the substrate 10 and word line 12. The filler layer 15 may be formed by a Selective Epitaxial Growth (SEG) method. In the SEG method, the crystalline silicon of the word line 12 exposed in the trench 13 may be used as a seed. Therefore, the filler layer 15 may include the crystalline silicon having the same crystallographic orientation as the word line 12 and the substrate 10.

Figure 6:
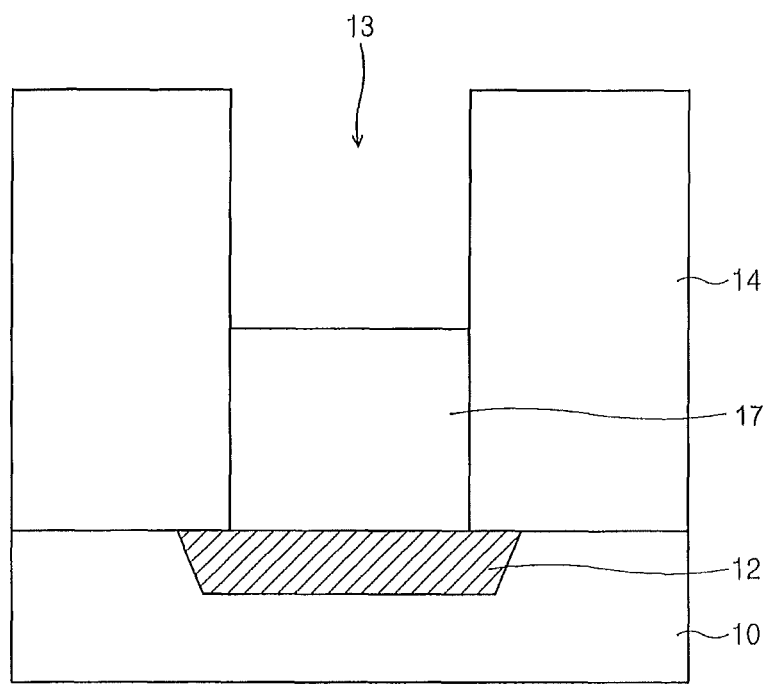

Referring to FIG. 6, an upper portion of the filler layer 15 located in an upper part of the trench 13 is removed so that a residual filler growth layer 17 remains at the bottom of the trench 13. The upper portion of the filler layer 15 may be removed using an etch-back process. The thickness of the residual filler growth layer 17 may be controlled by a time etching method.

Figure 7:
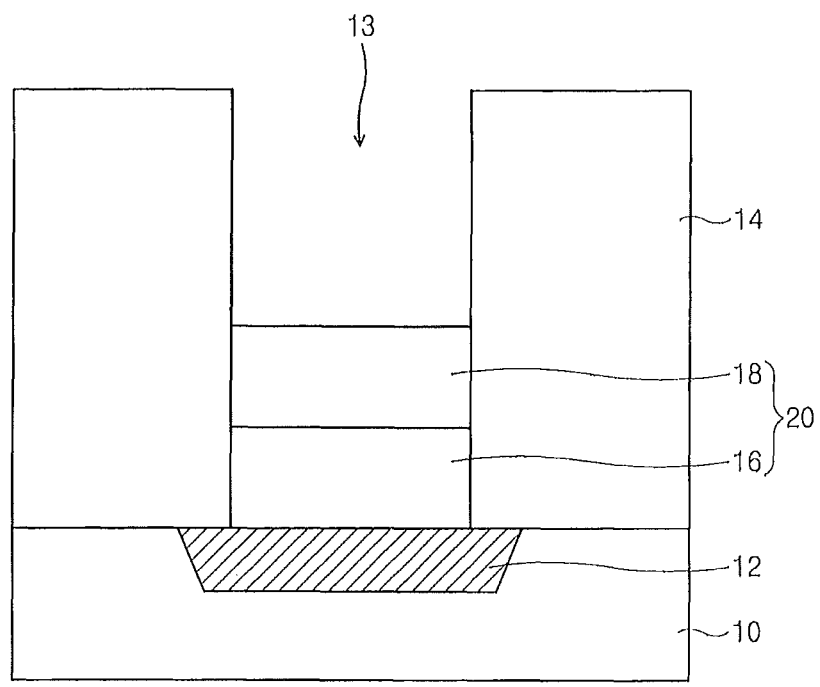

Referring to FIG. 7, the diode 20 can be formed by implanting impurities in the residual filler growth layer 17. The diode 20 may include first and second conductive impurity layers 16 and 18 formed in a depth direction in the trench 13. The first and second conductive impurity layers 16 and 18 may formed by doping with first and second conductive impurities, respectively. The first and second conductive impurities may be ion-implanted into the residual filler growth layer 17 at different energies. For example, the first conductive impurity may include n-type donors such as phosphor and arsenic. The second conductive impurity may include p-type acceptors such as boron and gallium. Herein, the word line 12 below the diode 20 may be doped with the first conductive impurity identical with the first conductive impurity layer 16.

Figure 8:
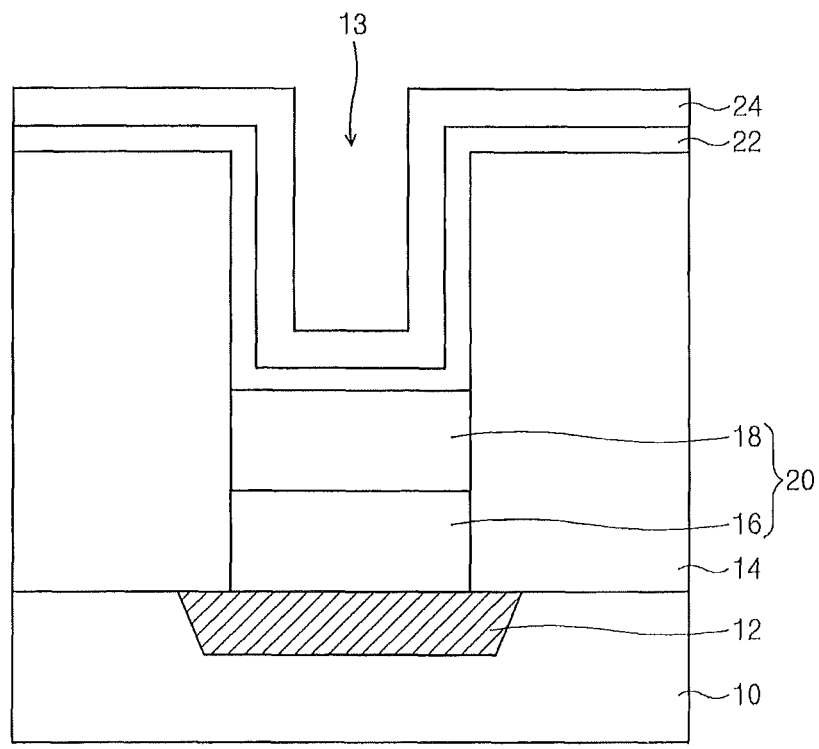

Referring to FIG. 8, a first metal layer 22 and a second metal layer 24 are formed on the substrate 10 and on the diode 20. The first metal layer 22 and the second metal layer 24 may be formed by a chemical vapor deposition method or sputtering method. The first metal layer 22 may include a silicide reactive metal of which the melting point is lower than that of the second metal layer 24. For example, the first metal layer 22 may include cobalt or nickel. The second metal layer 24 may include a diffusion metal with sufficient diffusibility for a silicide reaction of the first metal layer 22. For example, the second metal layer 24 may include at least one of titanium, tantalum, tungsten, molybdenum, vanadium, hafnium and zirconium. Although not shown, a third metal layer may be further formed on the second metal layer 24. The third metal layer may include the same metal as the first metal layer 22. Also, the third metal layer may serve as a capping layer used for improving the morphology of the second metal layer 24. For example, the third metal layer may include a metal nitride layer such as a titanium nitride layer.

Figure 9:
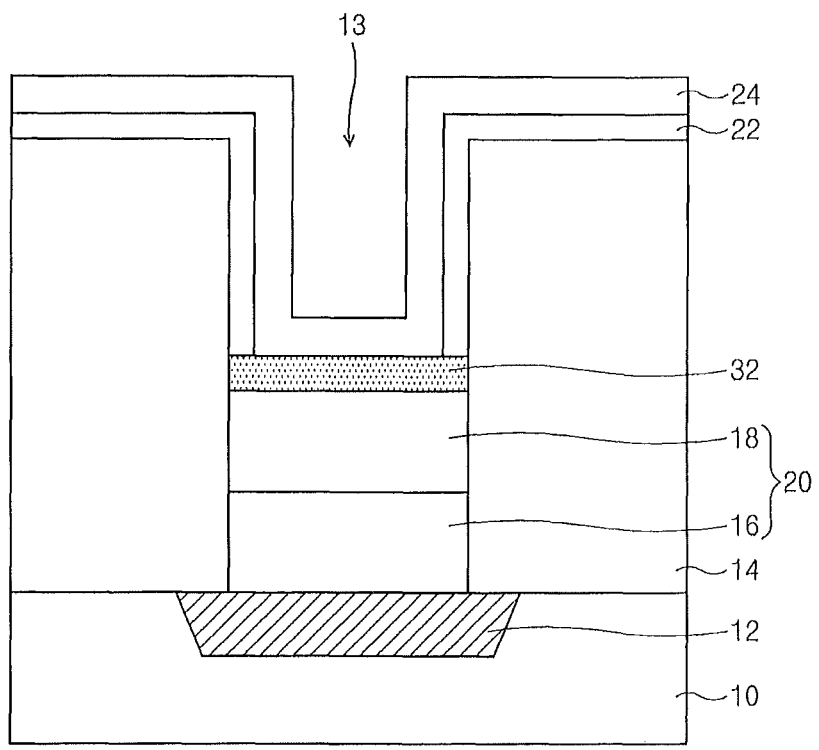

Referring to FIG. 9, a metal silicide layer 32 is formed on the diode 20 using a first annealing process. In some embodiments according to the inventive concept, the metal silicide layer 32 may be formed through the reaction between the first metal layer 22 and the second conductive impurity layer 18. The first annealing process may include a rapid thermal process (RTP) which is performed at a temperature of about 200° C. to about 650° C. For example, the metal silicide layer 32 may include cobalt silicide or nickel silicide. In some embodiments according to the inventive concept, a metal constituent of the second metal layer 24 may be diffused into the metal silicide layer 32 during the first annealing process.

Figure 10:
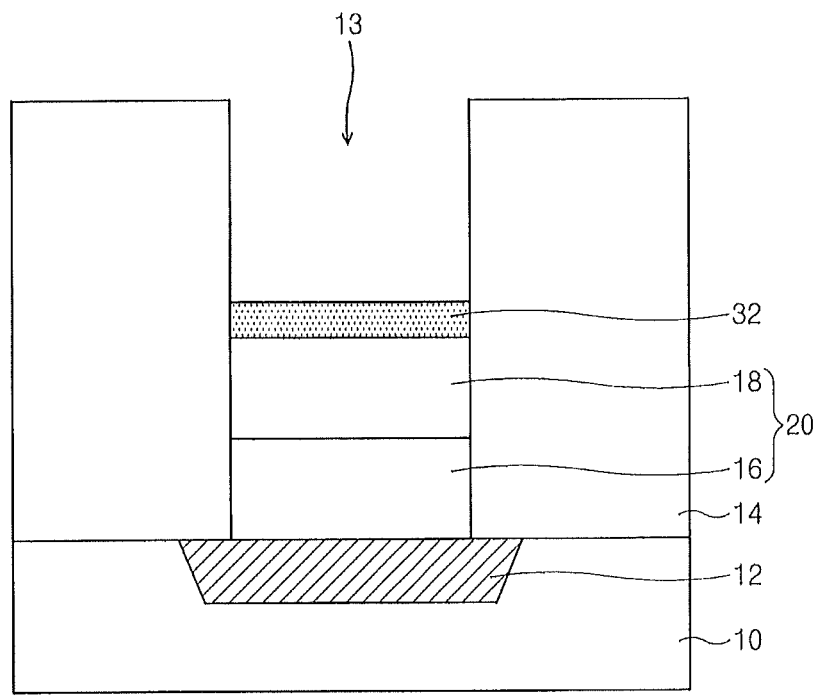

Referring to FIG. 10, the residue of the first metal layer 22 and the second metal layer 24 on the metal silicide layer 32 are removed. The first metal layer 22 and the second metal layer 24 may be removed by wet etching or dry etching using an etchant or etching gas having an etch selectivity with respect to the metal silicide layer 32. That is, the first metal layer 22 and the second metal layer 24 including the single metal constituent remaining after the metal silicide reaction may be removed by the etching process.

The metal silicide layer 32 may include a large quantity of the metal constituent in the second metal layer 24. For example, cobalt silicide may include titanium as shown in FIGS. 21 through 23.

Figure 21:
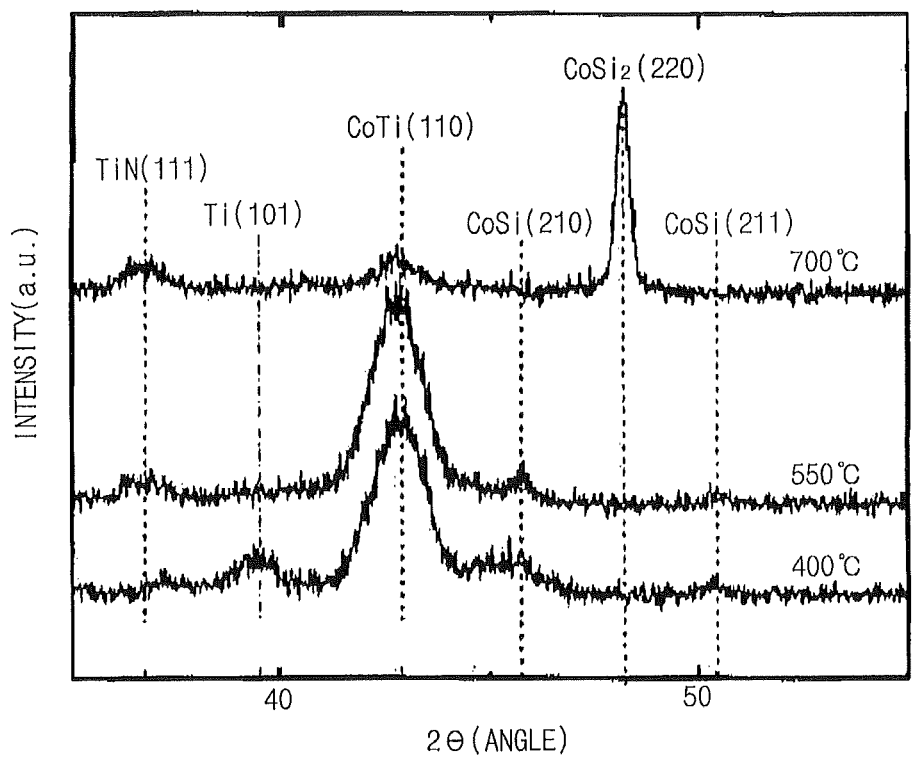
FIG. 21 is a graph showing the X-ray diffraction analysis result of a metal silicide layer.

FIG. 21 is a graph showing the X-ray diffraction results of an analysis of the metal silicide layer 32. Herein, the axis of the abscissas in the graph represents the angle corresponding to 2θ (2-theta) of the X-ray diffraction analysis and the axis of ordinates represents 2θ peak intensity. The cobalt silicide may be formed from about 12 nm of cobalt and about 15 nm of titanium on the silicon substrate 10. Through the first annealing process, the cobalt silicide may include substantial cobalt titanium, titanium nitride and titanium.

Figure 22:
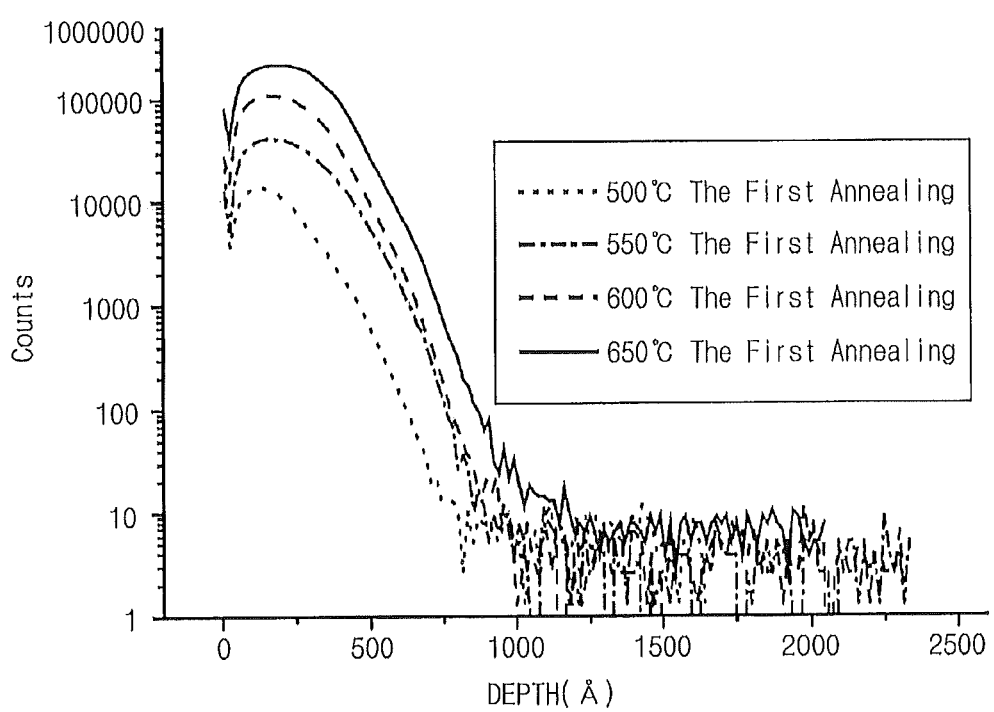
FIG. 22 is a secondary ion mass spectrometry (SIMS) depth profile graph showing the numbers of titanium diffused in the metal silicide layer depending on the temperature change of a first annealing process.
Figure 23:
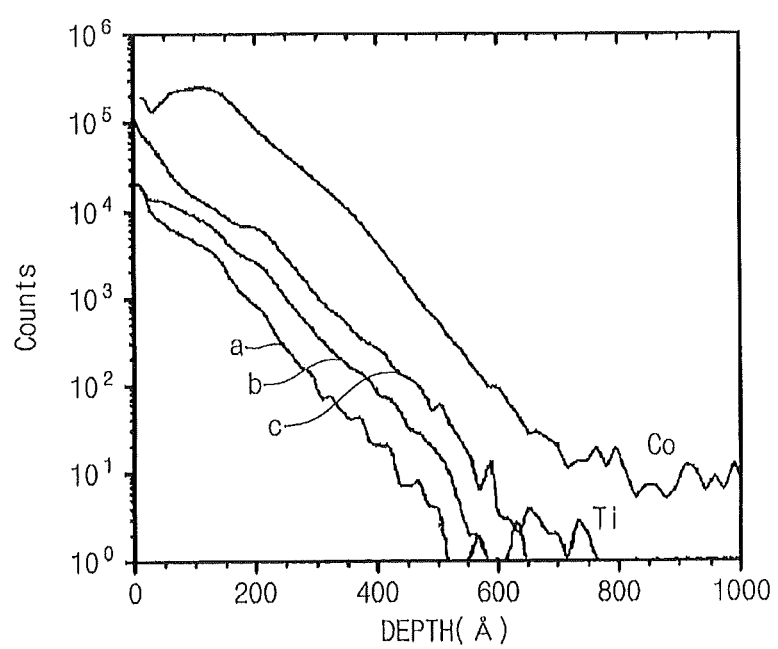
FIG. 23 is a SIMS depth profile graph of the diffused titanium in the metal silicide layer depending on the thickness of titanium.

FIGS. 22 and 23 are secondary ion mass spectrometry (SIMS) depth profile graphs of titanium diffused in the metal silicide layer 32, wherein the metal silicide layer 32 may include a substantial amount of titanium when the temperature of the first annealing process is high and the thickness of titanium, as a diffusion metal, is high. Herein, the axis of abscissas of the graph represents the depth of the metal silicide layer 32 and the axis of ordinates represents the amount of titanium. FIG. 22 shows that the diffused titanium in the metal silicide layer 32 increased when the first annealing temperature was increased from 500° C. to 650° C. FIG. 23 shows that the diffused titanium in the metal silicide layer 32 increased when the thickness of titanium increases to 1.5 nm (represented as line a), 3 nm (represented as line b) and 5 nm (represented as line c), respectively. Also, the graphs in FIGS. 5 and 6 show in common that the diffused titanium in the metal silicide layer 32 decreases in the depth direction.

Therefore, the manufacturing method of the memory device according to some embodiments of the inventive concept may enable an increased amount of metal constituent in the second metal layer 24 to be diffused into the metal silicide layer 32 on the diode 20 through the first annealing process.

Figure 11:
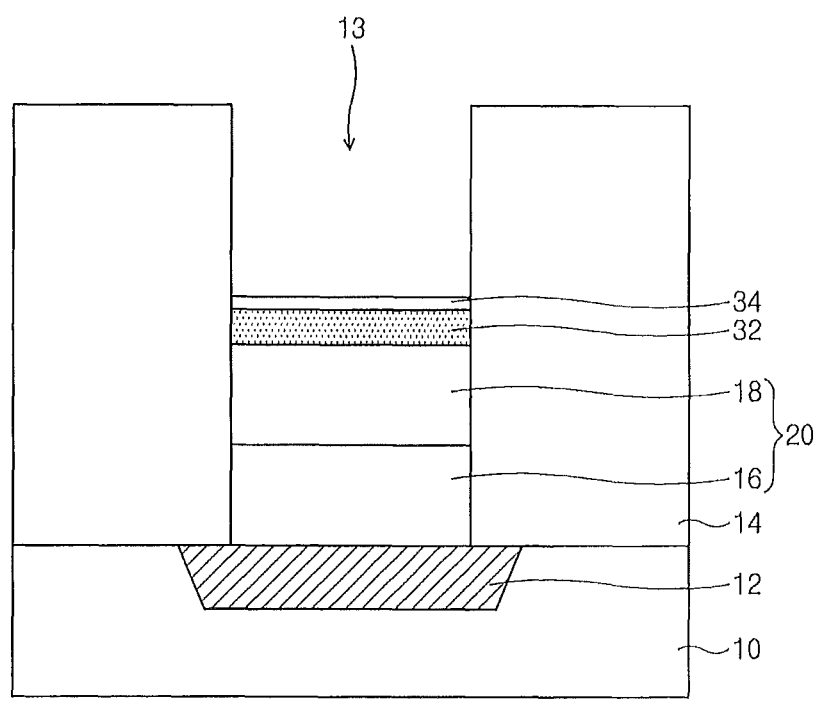

Referring to FIG. 11, an insulating oxide layer 34 is formed on the metal silicide layer 32. The insulating oxide layer 34 may be a native oxide layer, such as a silicon oxide layer in which the silicon in the metal silicide layer 32 combines with oxygen in an atmosphere to which the metal silicide layer 32 is exposed. The native oxide layer may be formed to a thickness of less than about 30 Å on the top surface of the metal silicide layer 32 in the atmosphere. The insulating oxide layer 34 may also be formed by a dummy annealing process of the metal silicide layer 32.

Figure 12:
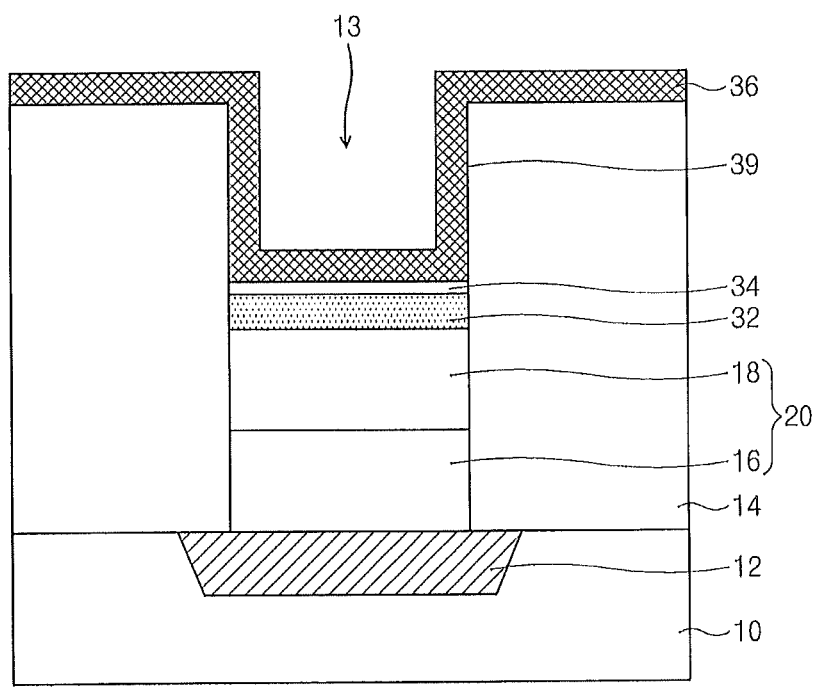

Referring to FIG. 12, a resistive metal layer 36 is formed on the insulating oxide layer 34. The resistive metal layer 36 may include a metal silicon nitride layer formed by Metal-Organic Chemical Vapor Deposition (MOCVD). In some embodiments according to the inventive concept, the metal silicon nitride layer may have the resistivity that is about 10 times to about 100 times that of the metal silicide layer or metal nitride layer. For example, the metal silicon nitride layer may include a titanium silicon nitride layer, a tantalum silicon nitride layer, a zirconium silicon nitride layer and a tungsten silicon nitride layer. The titanium silicon nitride layer may be formed by the MOCVD method using Tetrakis (DiMethylAmino) Titanium (TDMAT) containing titanium nitride and Bis (Tertiary ButylAmino) Silane (BTBAS) containing silicon nitride as source gases. The MOCVD method may allow a metal silicon nitride layer to be formed on the substrate 10 through chemical reaction from a high-temperature source gas of about 200° C. or more without using plasma reaction. Therefore, according to the MOCVD method, the metal silicon nitride layer may be formed without removing the insulating oxide layer 34, such as the native oxide layer formed on the top surface of the metal silicide layer 32.

Figure 13:
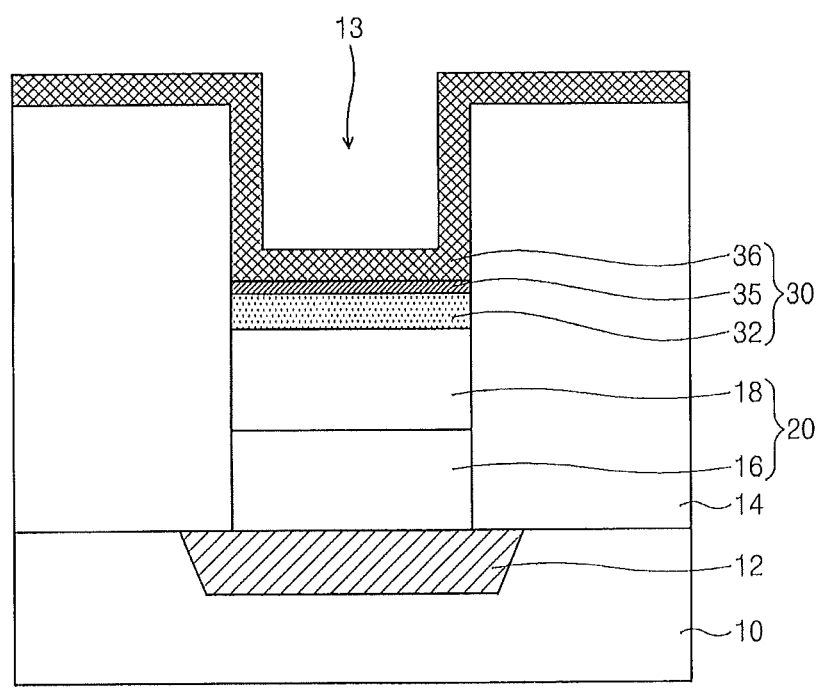

Referring to FIG. 13, a second annealing process is performed so that the metal oxide layer 35 is formed from the insulating oxide layer 34 that is located between the metal silicide layer 32 and metal silicon nitride layer (i.e., the resistive metal layer 36). For example, the metal oxide layer 35 may include at least one of a titanium oxide layer, a tantalum oxide layer, a tungsten oxide layer, a molybdenum oxide layer, a vanadium oxide layer, a hafnium oxide layer and a zirconium oxide layer. The second annealing process may include RTP performed at about 500° C. to about 750° C. The second annealing process may replace the insulating constituent in the insulating oxide layer 34 with the metal constituent of the second metal layer 24 diffused from the metal silicide. The insulating oxide layer 34 may be transformed to a substantial amount of the metal oxide layer 35 in proportion to the temperature of the second annealing process.

Therefore, the manufacturing method of the memory device according to the first embodiment of the inventive concept may allow an increase in a production yield since the conductivity of the lower electrode 30 may be increased by transforming the insulating oxide layer 34 on the top surface of the metal silicide layer 32 into the metal oxide layer 35.

Figure 14:
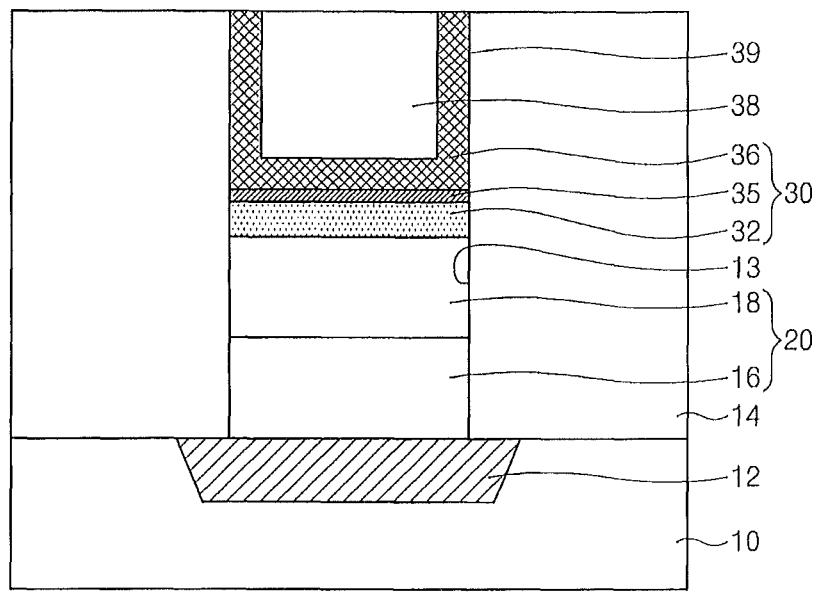

Referring to FIG. 14, a gap-fill insulation layer 38 is formed on the resistive metal layer 36, and the surface of the substrate 10 is planarized until the mold insulation layer 14 is exposed. The gap-fill insulation layer 38 may be formed on the resistive metal layer 36 to fill the trench 13. The gap-fill insulation layer 38 may include the same silicon oxide layer as the mold insulation layer 14. The gap-fill insulation layer 38 and resistive metal layer 36 may be removed by Chemical Mechanical Polishing (CMP) performed on the mold insulation layer 14. Therefore, the resistive metal layer 36 may be exposed in a circular or polygonal ring shape by the mold insulation layer 14 and gap-fill insulation layer 38.

Figure 15:
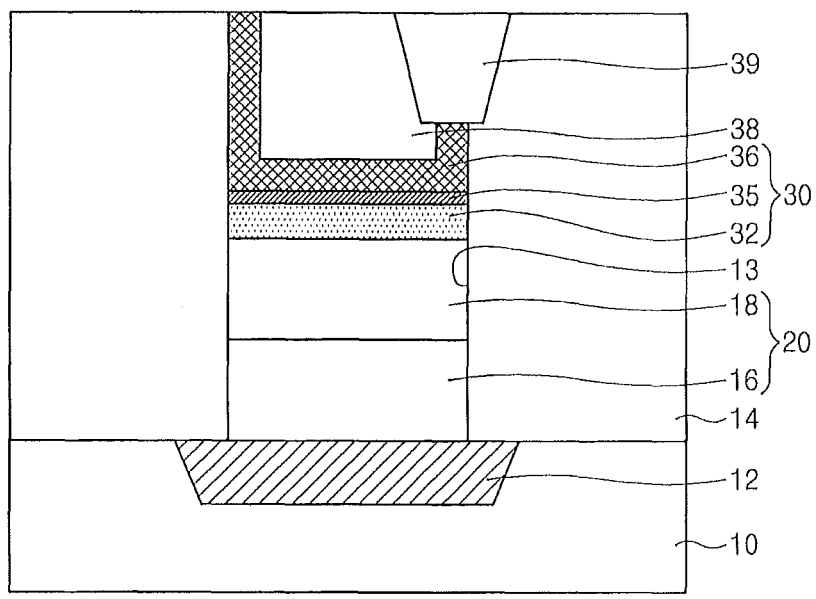

Referring to FIG. 15, a trimming insulation layer 39 is formed in a wedge shape on a portion of the resistive metal layer 36. The trimming insulation layer 39 may control the amount of surface area of the resistive metal layer 36 that is exposed between the mold insulation layer 14 and gap-fill insulation layer 38. The trimming insulation layer 39 may be filled into partially etched portions of the resistive metal layer 36, mold insulation layer 14 and gap-fill insulation layer 38.

Figure 16:
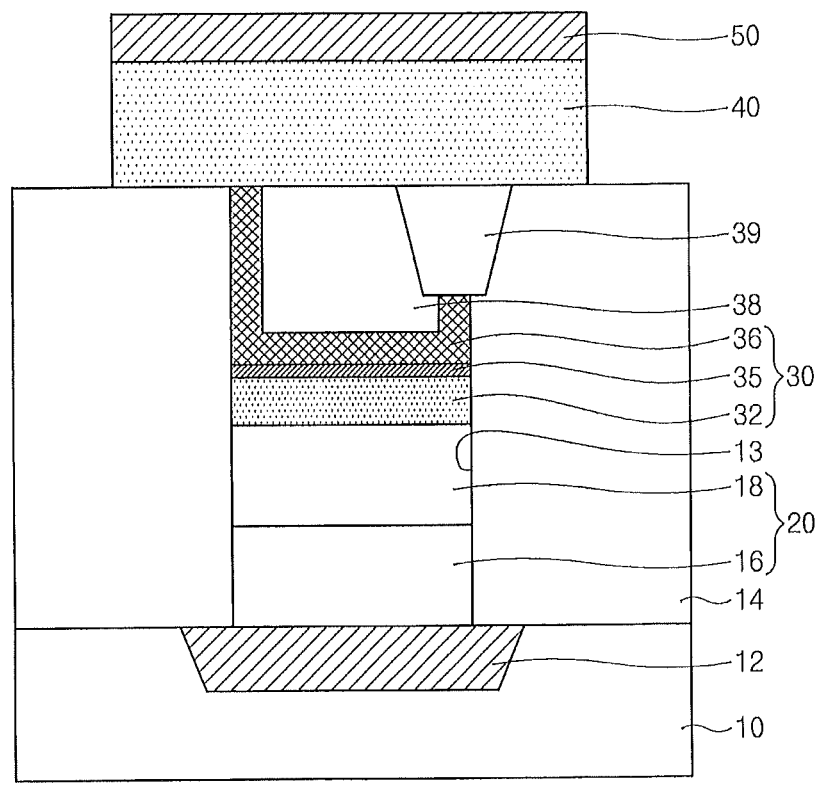

Referring to FIG. 16, a phase-change layer 40 and an upper electrode 50 are formed in a stack on the lower electrode 30 through a chemical vapor deposition and/or physical vapor deposition process, and thereafter patterned by a photolithography process. The phase-change layer 40 may include Germanium-Antimony-Tellurium (GST) or a chalcogenide compound obtained by doping the GST with carbon, nitrogen and/or metal. The upper electrode 50 may include at least one single metal of titanium, tungsten, aluminum, nickel, zirconium, molybdenum, ruthenium, palladium, hafnium, tantalum, iridium and platinum. Also, the upper electrode 50 may include at least one metal nitride layer of a titanium nitride layer, a nickel nitride layer, a zirconium nitride layer, a molybdenum nitride layer, a ruthenium nitride layer, a palladium nitride layer, a hafnium nitride layer, a tantalum nitride layer, an iridium nitride layer, a platinum nitride layer, a tungsten nitride layer, an aluminum nitride layer, a niobium nitride layer, a titanium aluminum nitride layer, a zirconium aluminum nitride layer, a molybdenum aluminum nitride layer and a tantalum aluminum nitride layer.

Figure 17:
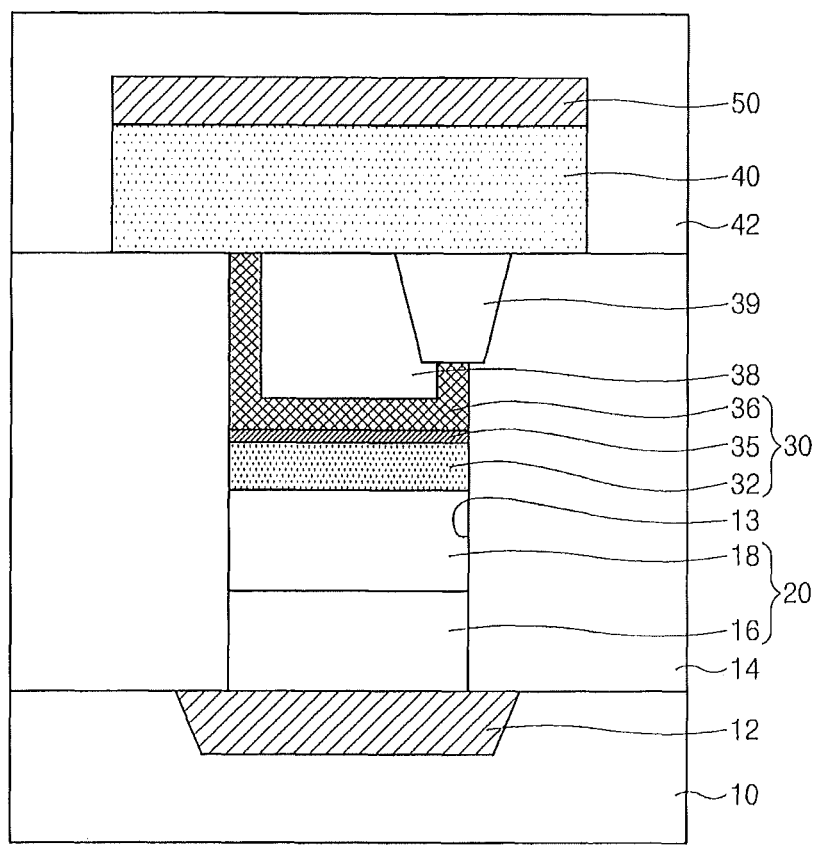

Referring to FIG. 17, an interlayer dielectric 42 is formed on the phase-change layer 40 and the upper electrode 50. The interlayer dielectric 42 may include the same silicon oxide layer as the mold insulation layer 14.

Figure 18:
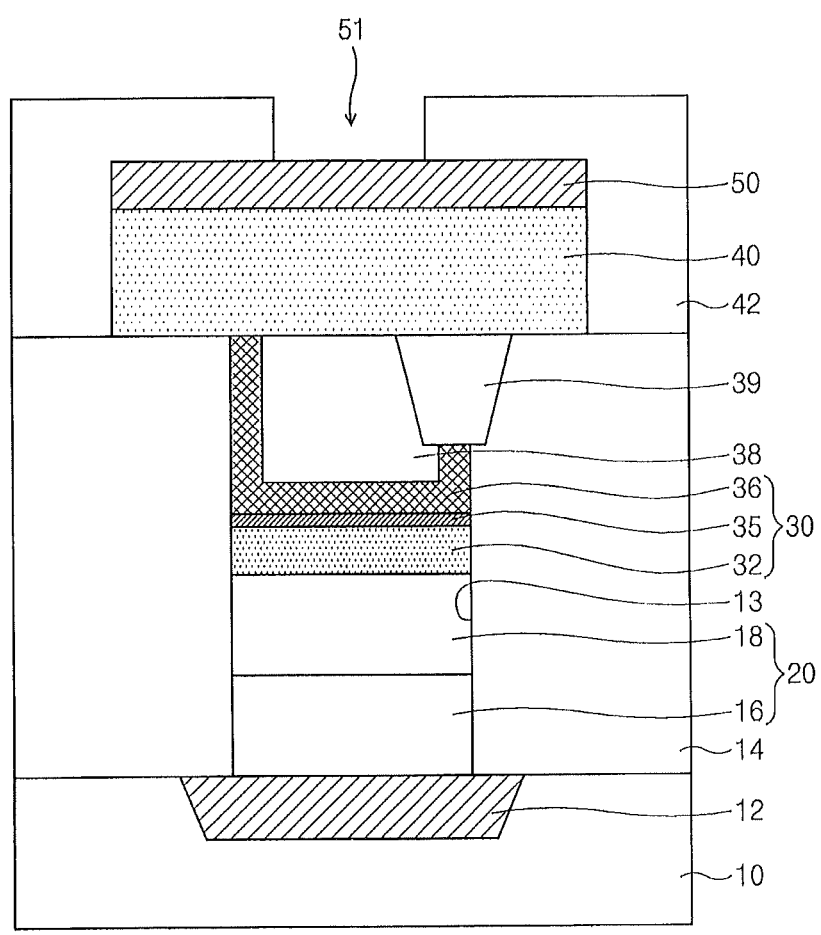

Referring to FIG. 18, a contact hole 51 is formed by a removing a portion of the interlayer dielectric 42 to expose a portion of the upper electrode 50. The contact hole 51 may be formed by a photolithography process. The photolithography process may include a photo process of forming a photoresist pattern exposing the interlayer dielectric 42 above the upper electrode 50, and an etching process of removing the interlayer dielectric 42 by using the photoresist pattern as an etching mask.

Figure 19:
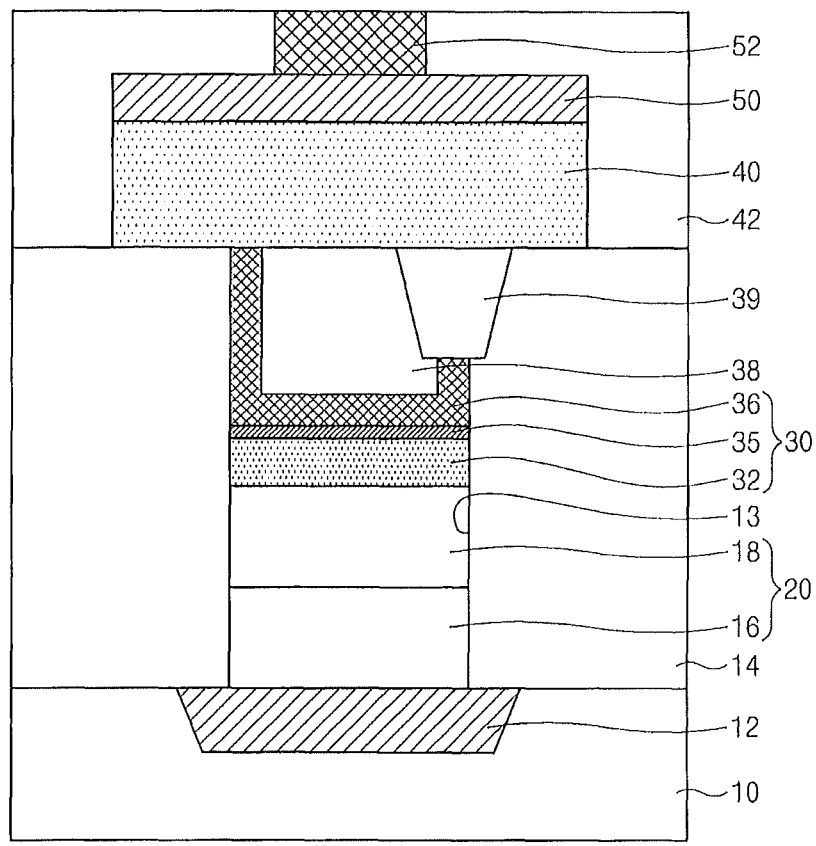

Referring to FIG. 19, a contact plug 52 is formed in the contact hole 51 by depositing a metal layer such as tungsten, aluminum, copper, tantalum, titanium. The contact plug 52 may be formed by the etch-back process or planarization process of the metal layer that exposes the interlayer dielectric 42 after filling up the metal layer in the contact hole 51.

Figure 20:
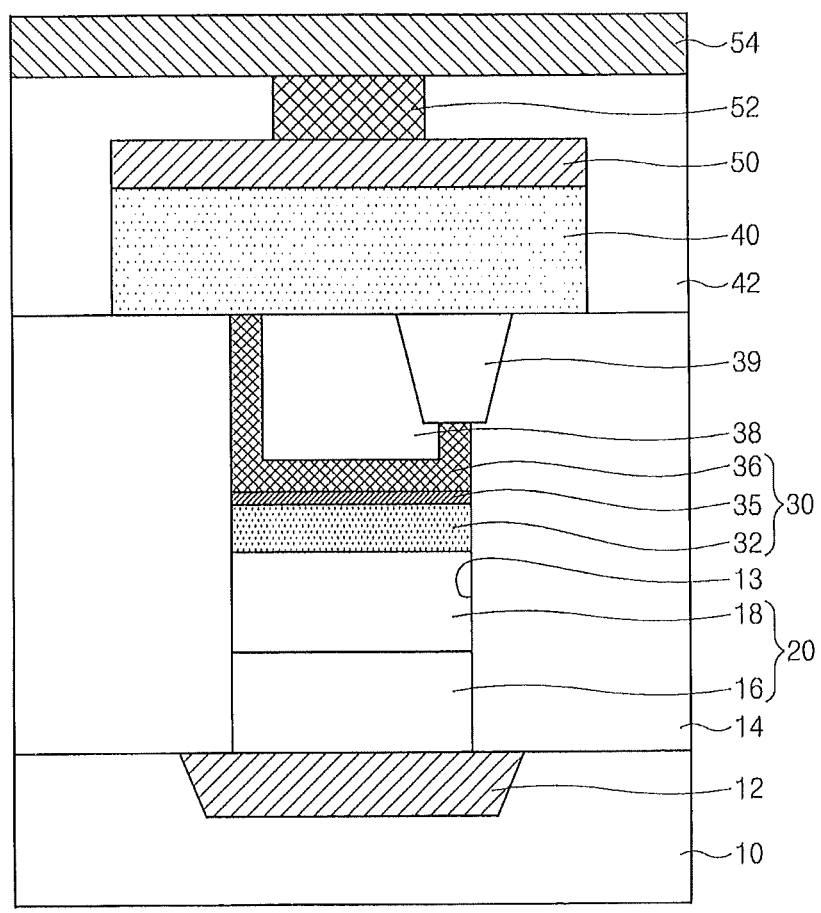

Referring to FIG. 20, a bit line 54 is formed on the contact plug 52 to include a metal layer having sufficient conductivity such as tungsten, aluminum, copper, tantalum, and titanium. The bit line 54 may be formed by a deposition process of the metal layer and a photolithography process patterning the metal layer. The deposition process of the metal layer may include a sputtering method or chemical vapor deposition method. The photolithography process may include a photo process of forming a photoresist pattern, and an etching process of removing the metal layer by using the photoresist pattern as an etching mask.

Therefore, the memory device formed according to the embodiment of the inventive concept illustrated in FIGS. 1-20 can enable the formation of the lower electrode 30 including the metal oxide layer 35 to have sufficient conductivity between the metal silicide layer 32 and resistive metal layer 36.

FIGS. 24 through 41 are cross-sectional views illustrating methods of forming memory devices including a phase change layer in some embodiments of the inventive concept.

Figure 24:
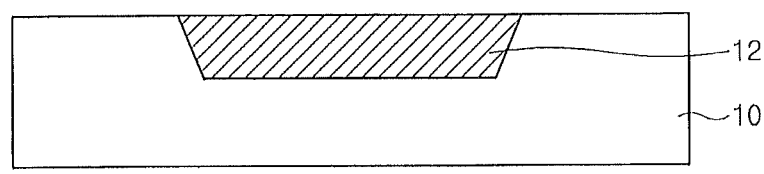
FIGS. 24 through 41 are cross-sectional views illustrating methods of forming memory devices according to an embodiment of the inventive concept.

Referring to FIG. 24, a word line 12 is formed on a substrate 10, including crystalline silicon. The word line 12 may include a conductive region in which conductive ion impurities are implanted into the crystalline silicon. The conductive region may include at least one of a conductive impurity region, contact pad, contact plug, conductive metal pattern and gate electrode arranged on the substrate 10. Although not shown, the conductive region may be insulated by a device isolation layer or interlayer dielectric 42 on the substrate 10.

Figure 25:
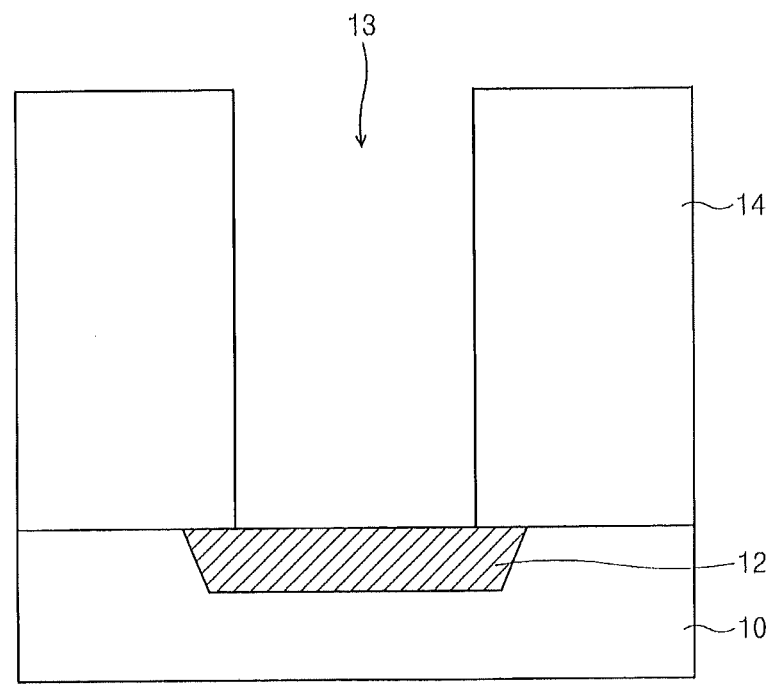

Referring to FIG. 25, a mold insulation layer 14 is formed on the substrate 10, and a trench 13 is formed therein which exposes the word line 12. The mold insulation layer 14 may include a silicon oxide layer formed by at least one method of USG (Undoped Silicate Glass), BPSG (Boron-Phosphor Silicate Glass), PSG (Phosphor Silicate Glass), BSG (Boron Silicate Glass), SOG (Spin On Glass), TEOS (Tetraethylorthosilicate), PE-TEOS (Plasma Enhanced-Tetraethylorthosilicate), and HDP-CVD (High Density Plasma-Chemical Vapor Deposition). The trench 13 may be formed by a photolithography process. For example, the photolithography process may include a photo process of forming a photoresist pattern exposing the mold insulation layer 14 above the word line 12, and an etching process of removing the mold insulation layer 14 by using the photoresist pattern as an etching mask.

Figure 26:
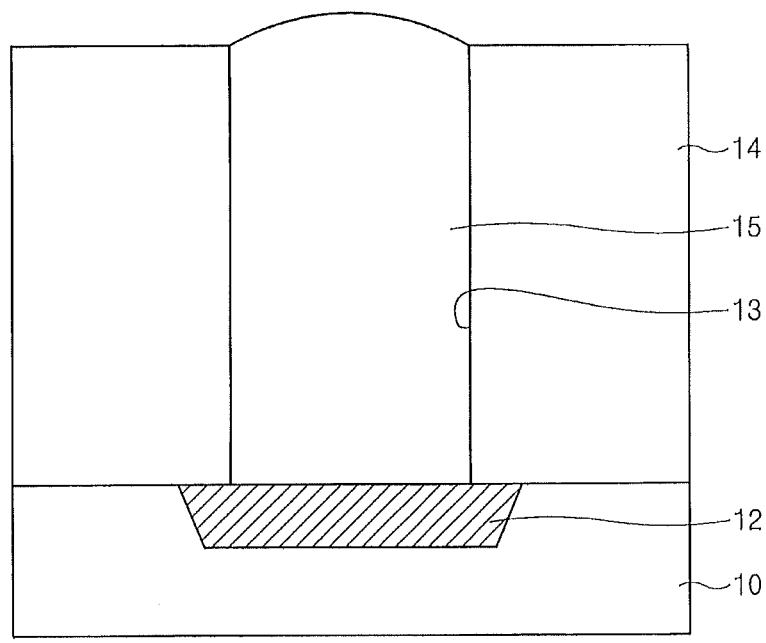

Referring to FIG. 26, a filler layer 15 is formed in the trench 13, using for example the same crystalline silicon as included in the substrate 10 and the word line 12. The filler layer 15 may be formed by a Selective Epitaxial Growth (SEG) method, wherein the crystalline silicon of the word line 12 exposed in the trench 13 is used as a seed. Therefore, the filler layer 15 may include the crystalline silicon having the same crystallographic orientation as the word line 12 and the substrate 10.

Figure 27:
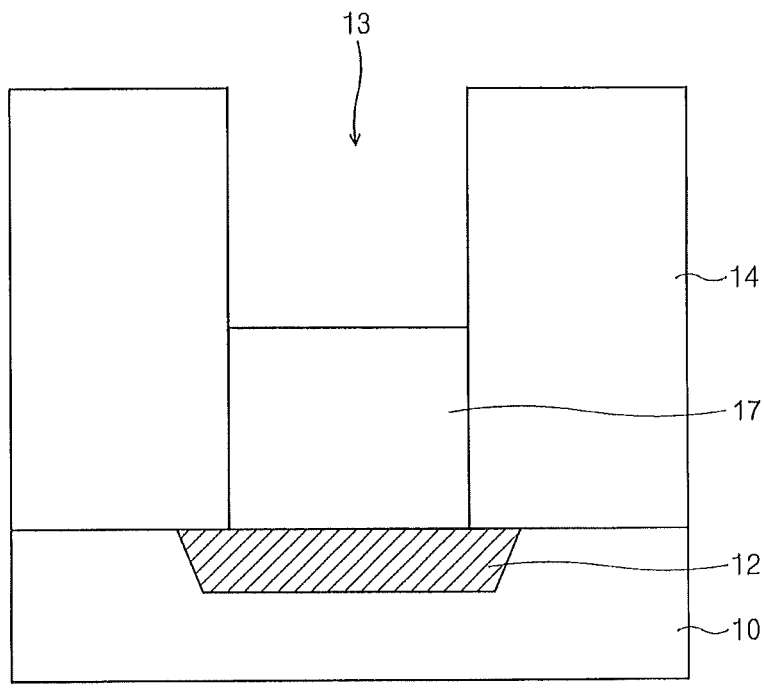

Referring to FIG. 27, an upper portion of the filler layer 15 in an upper part of the trench 13 is removed to provide a residual filler growth layer 17 at the bottom of the trench 13. The filler layer 15 may be removed using an etch-back process. Further, the thickness of the residual filler growth layer 17 may be controlled by a timing the etching process to cease at an appropriate point.

Figure 28:
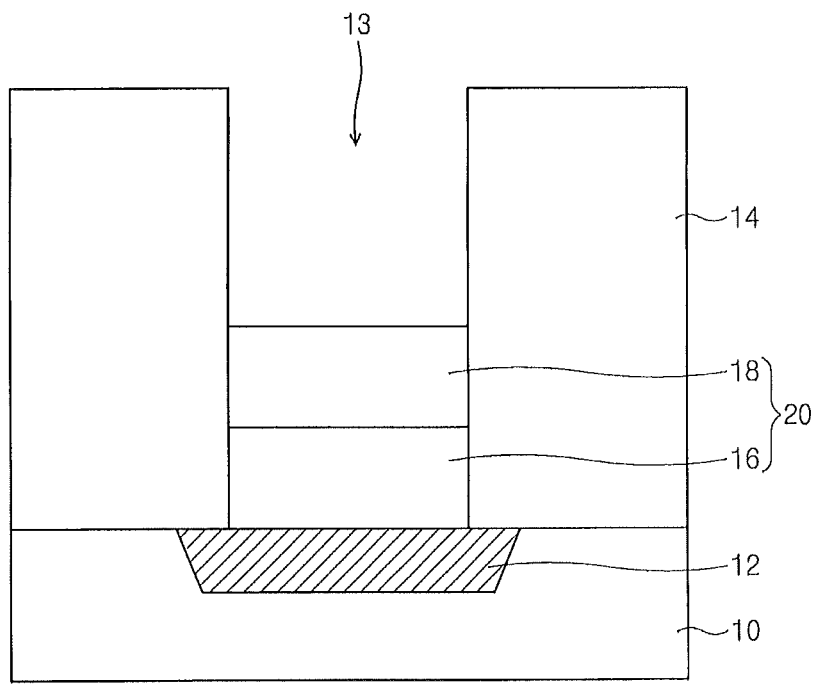

Referring to FIG. 28, a diode 20 is formed from the residual filler growth layer 17 by implanting conductive impurities therein to different depths to form first and second conductive impurity layers 16 and 18 in the trench 13. The first and second conductive ion impurities may be implanted into the residual filler growth layer 17 at different energies. For example, the first conductive impurity may include n-type donors such as phosphor and arsenic. The second conductive impurity may include p-type acceptors such as boron and gallium. The word line 12 below the diode 20 may be doped with the first conductive impurity identical with the first conductive impurity layer 16.

Figure 29:
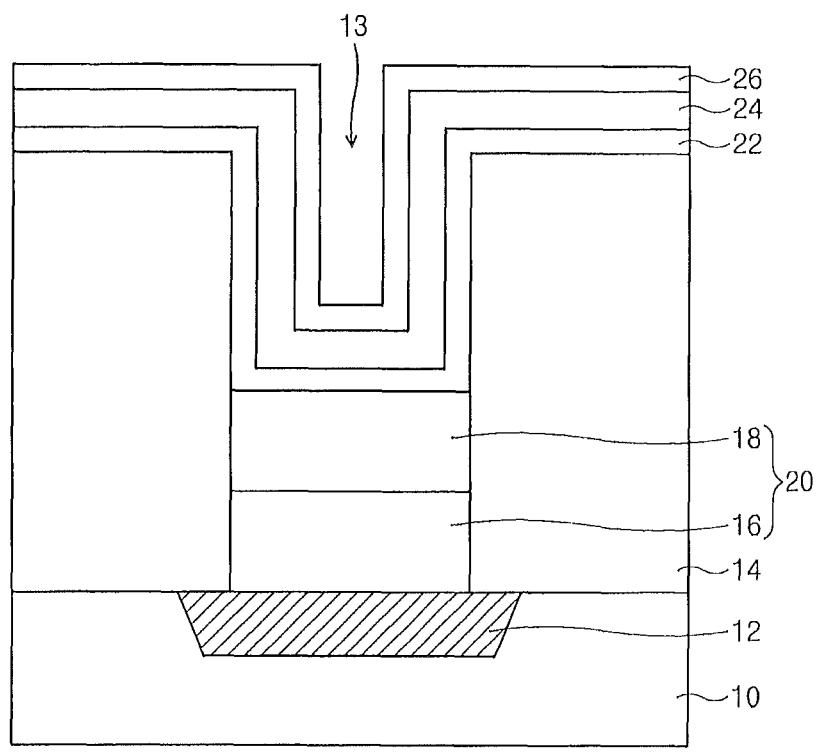

Referring to FIG. 29, a first metal layer 22, a second metal layer 24 and a third metal layer 26 are stacked on the substrate 10 including the diode 20. The first metal layer 22, the second metal layer 24 and the third metal layer 26 may be formed by a chemical vapor deposition method or sputtering method.

The first metal layer 22 may have a higher melting point than the second metal layer 24. The second metal layer 24 may penetrate the first metal layer 22 at a high temperature. The second metal layer 24 may include a silicide reactive metal undergoing a silicide reaction with the second conductive impurity layer 18 below the first metal layer 22. For example, the second metal layer 24 may include cobalt or nickel. The first metal layer 22 may include a diffusion metal with sufficient diffusibility for the silicide reaction of the second metal layer 24. For example, the first metal layer 22 may include at least one of titanium, tantalum, tungsten, molybdenum, vanadium, hafnium and zirconium. The third metal layer 26, which is a protective metal layer protecting the second metal layer 24 during the silicide reaction, may include a metal nitride layer such as titanium nitride layer.

Figure 30:
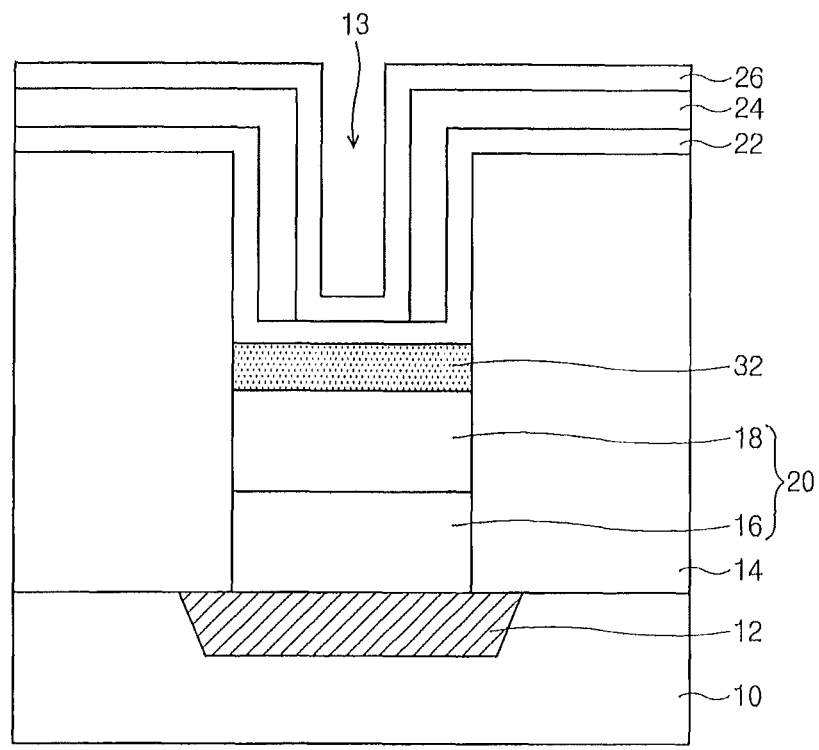

Referring to FIG. 30, a first annealing process is performed to form a metal silicide layer 32 on the diode 20. The metal silicide layer 32 may be formed through the reaction between the second metal layer 24 and the second conductive impurity layer 18. The first annealing process may include RTP which is performed at about 200° C. to about 650° C. The metal silicide layer 32 may be formed between the second conductive impurity layer 18 and the first metal layer 22, by sacrificing a portion of the second conductive impurity layer 18 in the depth direction. The metal silicide layer 32 may include the metal constituent of the second metal layer 24. For example, the metal silicide layer 32 may be formed to a thickness of about 200 Å to about 300 Å and may include cobalt silicide or nickel silicide. Therefore, the metal constituent of the second metal layer 24 may undergo a metal silicide reaction with the second conductive impurity layer 18 after penetrating the first metal layer 22. The third metal layer 26 may improve the morphology of the second metal layer 24.

The second metal layer 24 may be removed or reduced in thickness at the bottom of the trench 13 by the first annealing process. This is because amounts of the metal constituent of the second metal layer 24 are consumed at bottom of the trench 13 due to the metal silicide reaction. The metal silicide layer 32 may include the first metal layer 22 and the second metal layer 24. The metal component of the first metal layer 22 may diffuse into the metal silicide layer 32 during the first annealing process together with the consumption of the second metal layer 24. The penetration of the second metal layer 24 may accelerate the diffusion of the metal constituent of the first metal layer 22 into the metal silicide layer 32. Therefore, the first annealing process may diffuse a substantial amount of the metal constituent of the first metal layer 22 into the metal silicide layer 32.

Figure 31:
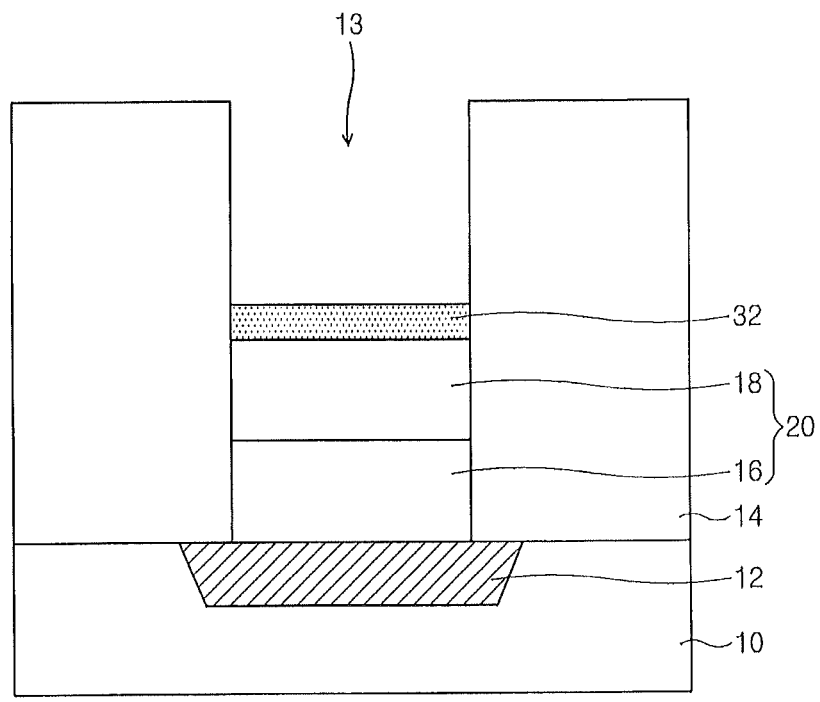

Referring to FIG. 31, the first metal layer 22, the second metal layer 24 and the third metal layer 26 on the metal silicide layer 32 are removed. The first metal layer 22, the second metal layer 24 and the third metal layer 26 may be removed by wet etching or dry etching using an etchant or etching gas having an etch selectivity with respect to the metal silicide layer 32. That is, the residual single metal constituent of the first metal layer 22, the second metal layer 24 and the third metal layer 26 after the metal silicide reaction may be removed by the etching process. The metal silicide layer 32 may include a substantial amount of the metal constituent of the first metal layer 22.

Therefore, methods of forming the memory devices as illustrated in FIGS. 27 to 33 in some embodiments of the inventive concept enable the metal silicide layer 32 to be formed on the diode 20 by the first annealing process and the metal constituent of the first metal layer 22 to be diffused into the metal silicide layer 32.

Figure 32:
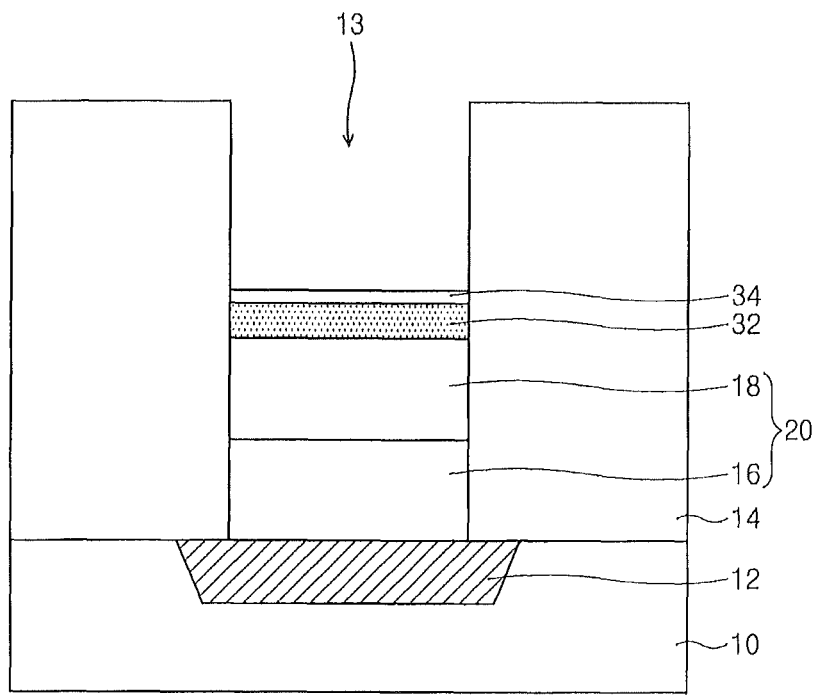

Referring to FIG. 32, an insulating oxide layer 34 is formed on the metal silicide layer 32. The insulating oxide layer 34 may include a native oxide layer such as silicon oxide layer in which the silicon contained in the metal silicide layer 32 is combined with oxygen in an atmosphere to which the metal silicide layer 32 is exposed. The native oxide layer may be formed to a thickness of about 30 Å on the top surface of the metal silicide layer 32 in the atmosphere. The insulating oxide layer 34 may also be formed by a dummy annealing process of the metal silicide layer 32.

Figure 33:
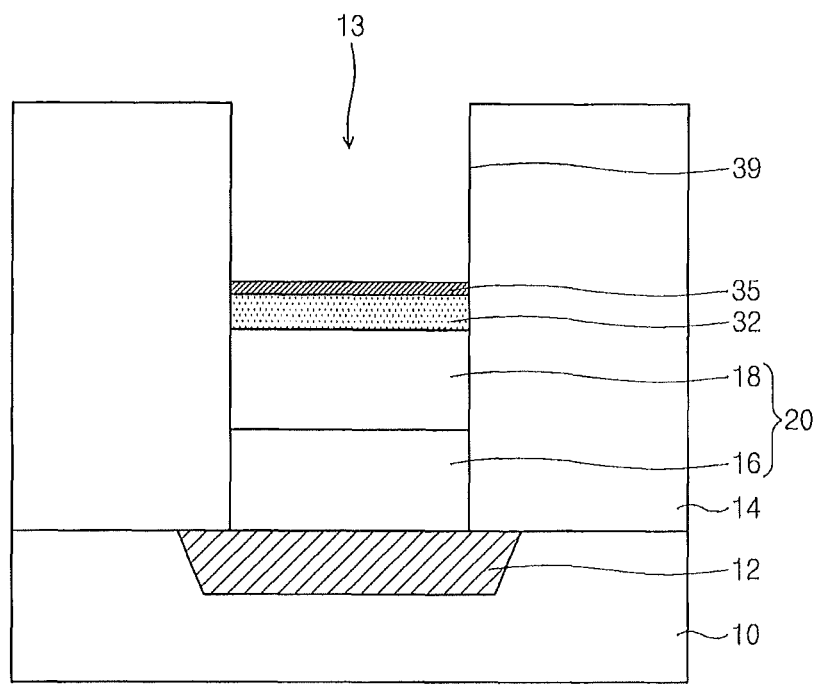

Referring to FIG. 33, the insulating oxide layer 34 is transformed to the metal oxide layer by a second annealing process of the insulating oxide layer 34. The second annealing process may include RTP performed at about 500° C. to about 750° C. The second annealing process may form the metal oxide layer 35 in which the insulating constituent in the insulating oxide layer 34 is replaced with the metal constituent of the first metal layer 22 diffused in the metal silicide. For example, the metal oxide layer 35 may include at least one of a titanium oxide layer, a tantalum oxide layer and a tungsten oxide layer.

Therefore, methods of forming the memory device illustrated above according to an embodiment of the inventive concept can allow an increase in the production yield since the insulating oxide layer 34 formed on the top surface of the metal silicide layer 32 may be transformed to the metal oxide layer 35.

Figure 34:
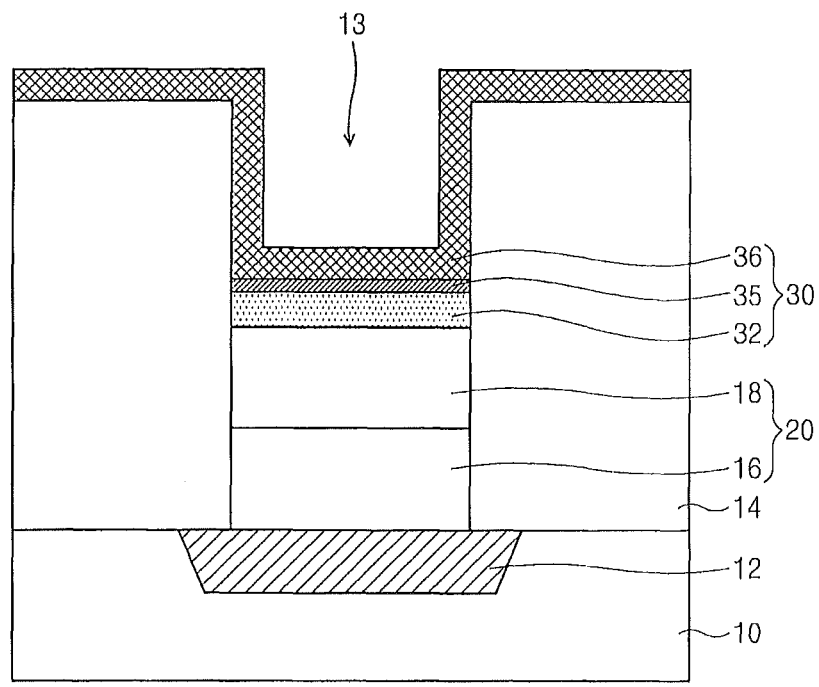

Referring to FIG. 34, a resistive metal layer 36 is formed on the metal oxide layer 35. The resistive metal layer 36 may include the metal silicon nitride layer formed by Metal-Organic Chemical Vapor Deposition (MOCVD). For example, the metal silicon nitride layer may include a titanium silicon nitride layer, a tantalum silicon nitride layer, a zirconium silicon nitride layer and a tungsten silicon nitride layer. The titanium silicon nitride layer may be formed by the MOCVD method using TDMAT containing titanium nitride and BTBAS containing silicon nitride as source gases. The MOCVD method may allow a metal silicon nitride layer to be formed on the substrate 10 through chemical reaction with a high-temperature source gas of about 200° C. or more without using plasma reaction. The metal silicon nitride layer may be formed to have a resistivity of about 10 to about 100 times that of metal silicide or metal nitride layer. Therefore, according to the MOCVD method, the metal silicon nitride layer may be formed without removing the insulating oxide layer 34 such as the native oxide layer formed on the top surface of the metal silicide layer 32.

Figure 35:
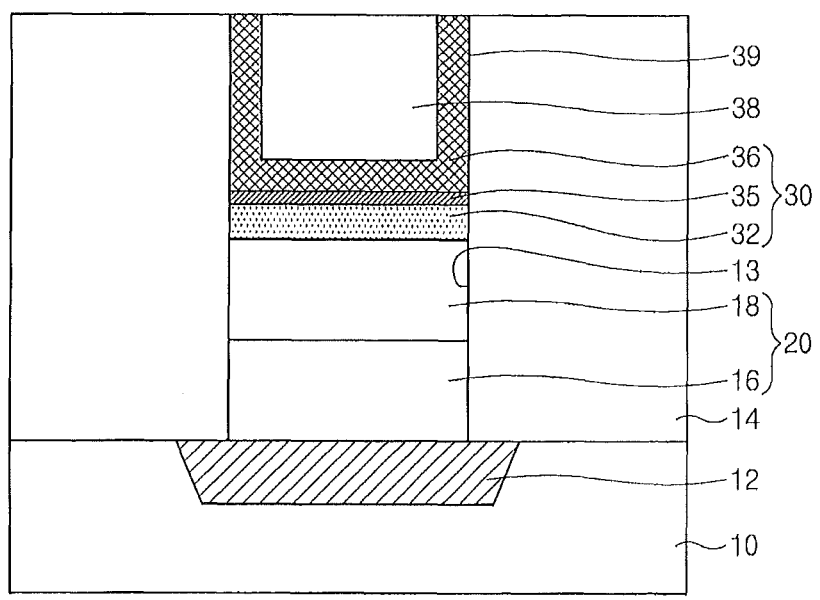

Referring to FIG. 35, a gap-fill insulation layer 38 is formed on the resistive metal layer 36, and the surface of the substrate 10 is planarized until the surface of the mold insulation layer 14 is exposed. The gap-fill insulation layer 38 may fill up the trench 13 on the resistive metal layer 36. The gap-fill insulation layer 38 may include the silicon oxide layer identical with the mold insulation layer 14. The gap-fill insulation layer 38 and resistive metal layer 36 may be planarized by Chemical Mechanical Polishing (CMP) the mold insulation layer 14. Therefore, the resistive metal layer 36 may be exposed in a circular or polygonal ring shape by the mold insulation layer 14 and gap-fill insulation layer 38.

Figure 36:
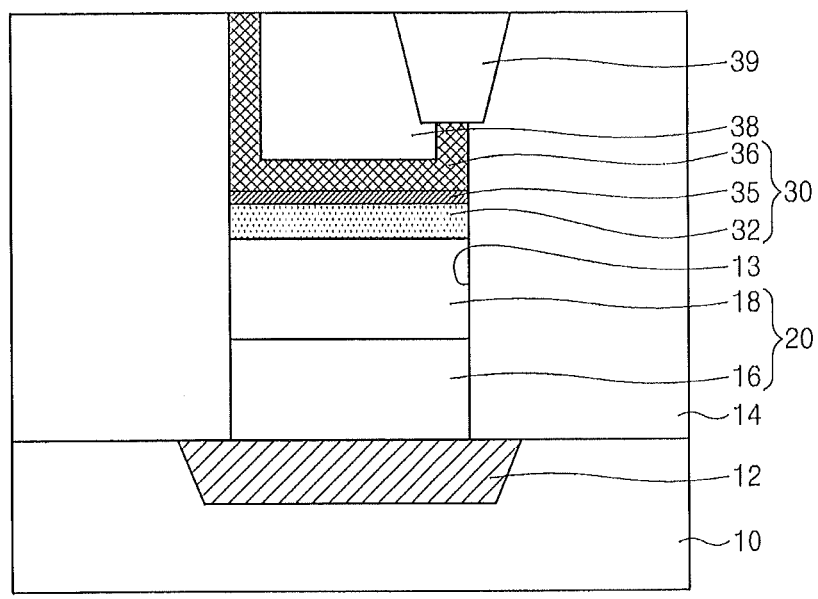

Referring to FIG. 36, a trimming insulation layer 39 shielding a part of the resistive metal layer 36 is formed. The trimming insulation layer 39 may be formed in a wedge shape on the resistive metal layer 36. The trimming insulation layer 39 may control the amount of surface area of the resistive metal layer 36 that is exposed between the mold insulation layer 14 and gap-fill insulation layer 38. The trimming insulation layer 39 may be deposited into partially etched portions of the resistive metal layer 36, mold insulation layer 14 and gap-fill insulation layer 38.

Figure 37:
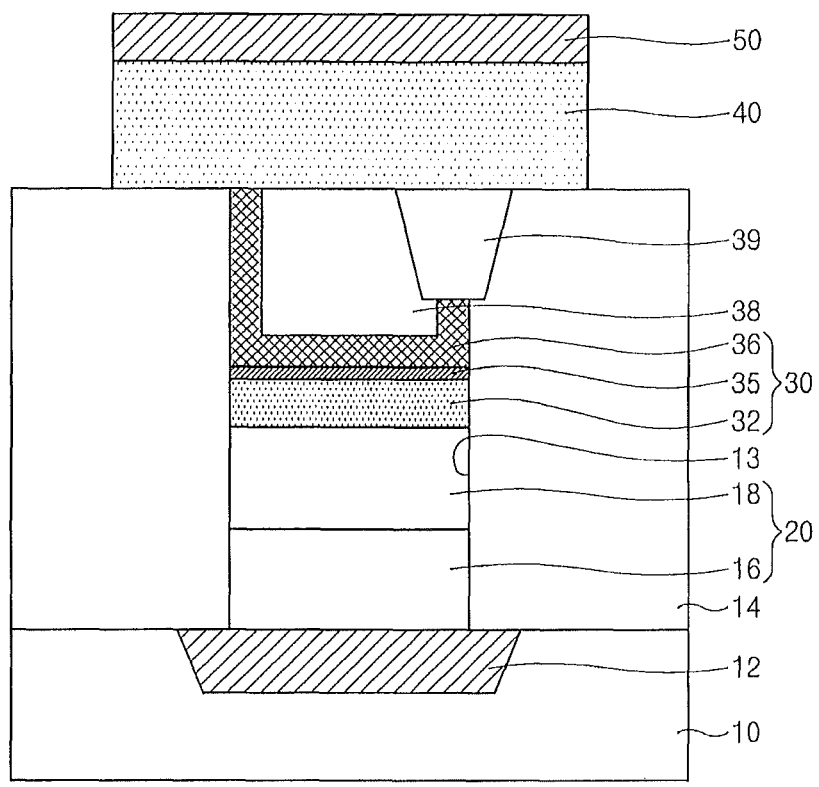

Referring to FIG. 37, the phase-change layer 40 and upper electrode 50 are formed on the resistive metal layer 36 using chemical vapor deposition and/or physical vapor deposition, and thereafter patterned by a photolithography process. The phase-change layer 40 may include Germanium-Antimony-Tellurium (GST) or a chalcogenide compound obtained by doping the GST with carbon, nitrogen and/or metal. The upper electrode 50 may include at least one single metal of titanium, tungsten, aluminum, nickel, zirconium, molybdenum, ruthenium, palladium, hafnium, tantalum, iridium and platinum. Also, the upper electrode 50 may include at least one metal nitride layer of a titanium nitride layer, a nickel nitride layer, a zirconium nitride layer, a molybdenum nitride layer, a ruthenium nitride layer, a palladium nitride layer, a hafnium nitride layer, a tantalum nitride layer, an iridium nitride layer, a platinum nitride layer, a tungsten nitride layer, an aluminum nitride layer, a niobium nitride layer, a titanium aluminum nitride layer, a zirconium aluminum nitride layer, a molybdenum aluminum nitride layer and a tantalum aluminum nitride layer.

Figure 38:
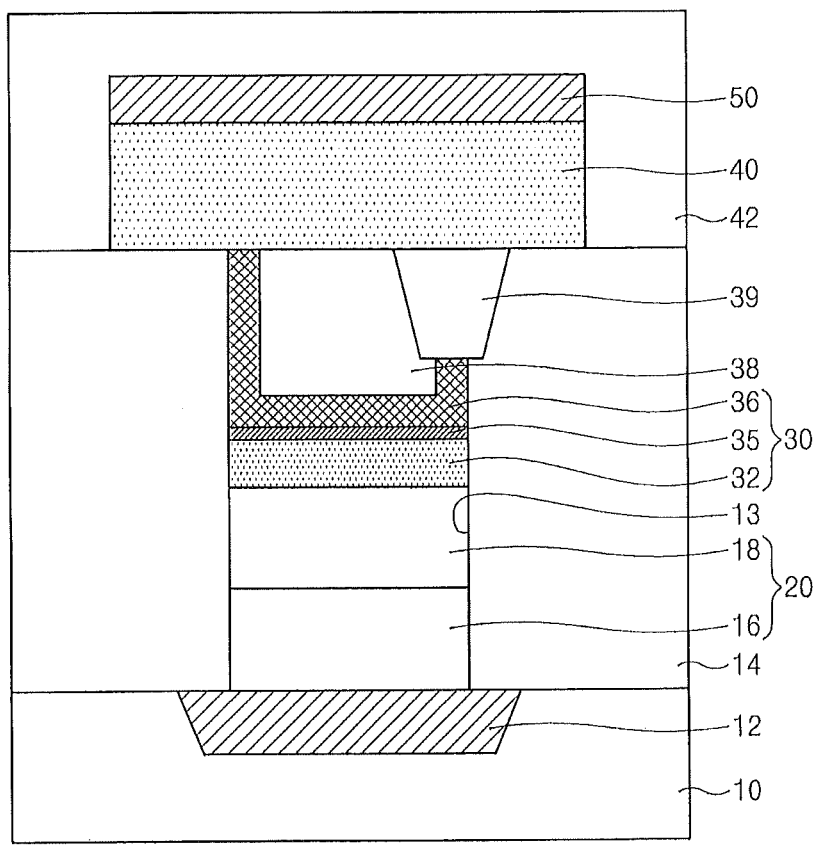

Referring to FIG. 38, an interlayer dielectric 42 is formed on the phase-change layer 40 and upper electrode 50. The interlayer dielectric 42 may include the same silicon oxide material as the mold insulation layer 14.

Figure 39:
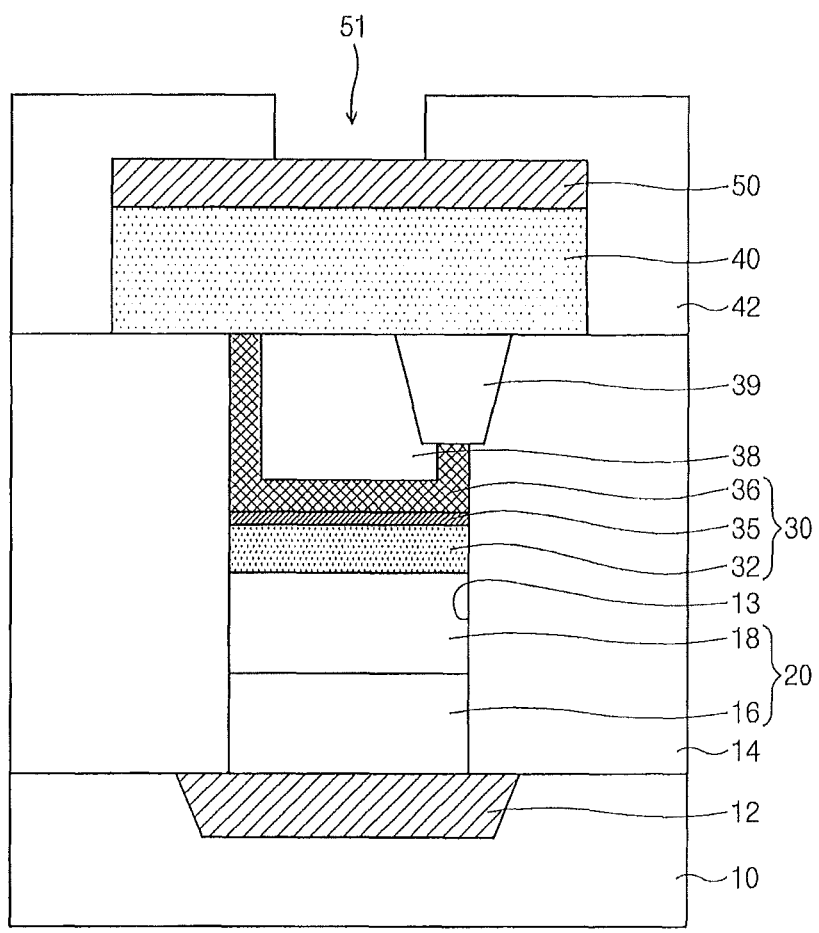

Referring to FIG. 39, a contact hole 51 is formed in the interlayer dielectric 42 to expose a portion of the upper electrode 50 using a photolithography process. The photolithography process may include a photo process where a photoresist pattern is formed to expose the interlayer dielectric 42 above the upper electrode 50, and the interlayer dielectric 42 is removed by etching using the photoresist pattern as an etching mask.

Figure 40:
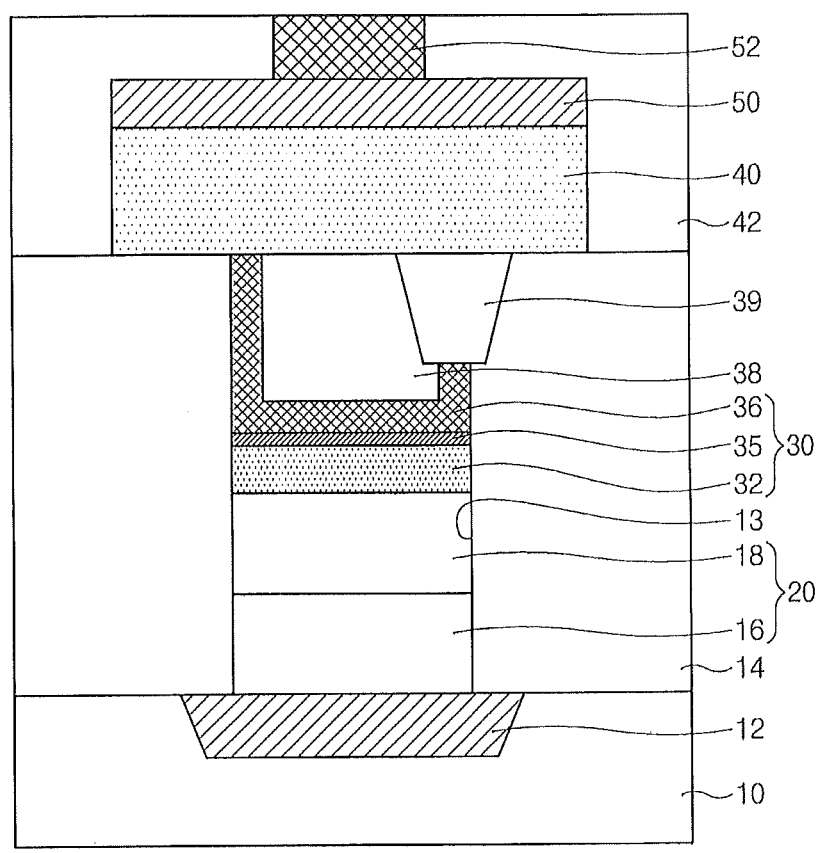

Referring to FIG. 40, a contact plug 52 is formed in the contact hole 51. The contact plug 52 may include a metal such as tungsten, aluminum, copper, tantalum, and/or titanium. The contact plug 52 may be formed by an etch-back process or planarization process applied to the metal layer to expose the interlayer dielectric 42 after depositing the metal layer in the contact hole 51.

Figure 41:
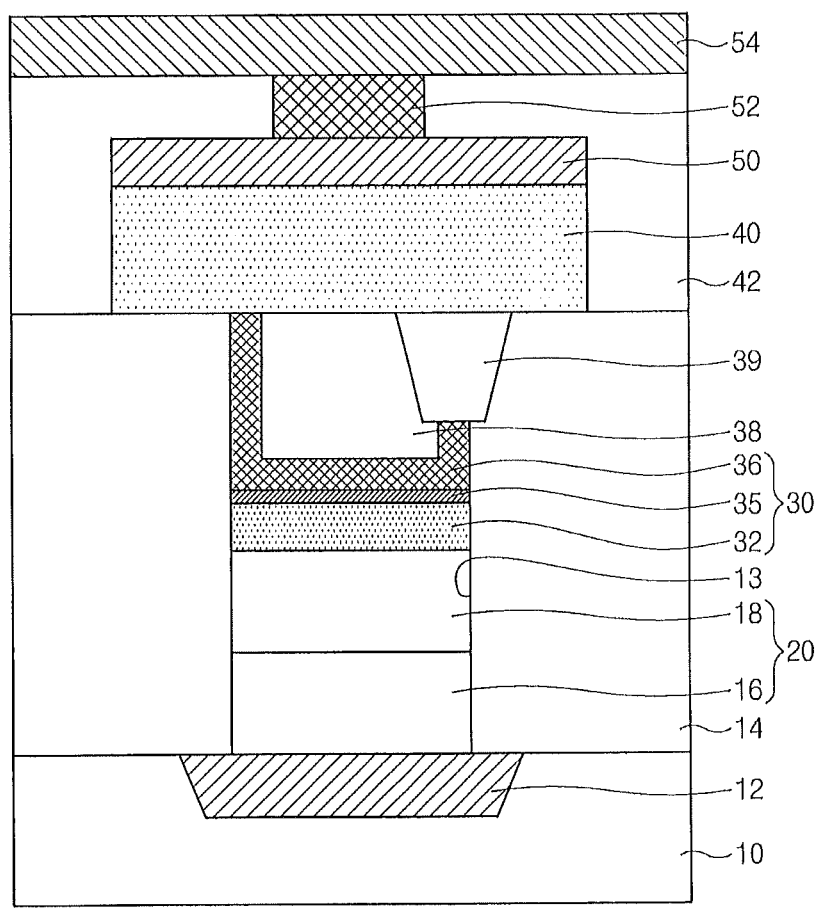

Referring to FIG. 41, a bit line 54 is formed on the contact plug 52 and may include a metal layer having sufficient conductivity, such as tungsten, aluminum, copper, tantalum, and/or titanium. The bit line 54 may be formed by a deposition process of the metal layer and a photolithography process patterning the metal layer. The deposition process of the metal layer may include a sputtering method or chemical vapor deposition method. The photolithography process may include a photo process of forming a photoresist pattern, and an etching process of removing the metal layer by using the photoresist pattern as an etching mask.

As described herein, in some embodiments according to the inventive concept, the lower electrode 30 can be formed to include the metal oxide layer 35 between the metal silicide layer 32 and the resistive metal layer 36.

Accordingly, in some embodiments according to the inventive concept, the native oxide layer formed on the metal silicide layer of the lower electrode may be transformed into the metal oxide layer.

Also, in some embodiments according to the inventive concept, the lower electrode may have stacked structure including the metal silicide layer, metal oxide layer and resistive metal layer.

In some embodiments according to the inventive concept, the conductivity of the lower electrode may be increased by including the metal oxide layer between the metal silicide layer and resistive metal layer.

While the inventive concept has been particularly shown and described with reference to the attached drawings thereof, it will be understood by those of ordinary skill in the art that various changes in form and details may be made therein without departing from the spirit and scope of the inventive concept as defined by the following claims. Therefore, the above-described embodiments are to be considered illustrative and not restrictive.

What is claimed is:

1. A phase-change memory device, comprising:
a substrate;
a conductive region on the substrate;
a lower electrode on the conductive region;
an upper electrode on the lower electrode; and
phase-change layer between the lower electrode and the upper electrode, the lower electrode comprising:
   a metal silicide layer on the conductive region;
   a metal silicon nitride layer comprising a resistivity of about 10 to about 100 times that of the metal silicide layer; and
   a metal oxide layer between the metal silicon nitride layer and the metal silicide layer, wherein the metal silicon nitride layer is between the metal oxide layer and the phase-change layer, and wherein the metal oxide layer comprises a resistivity that is greater than that of the metal silicide layer and less than the resistivity of the metal silicon nitride layer.

2. The device of claim 1, wherein a metal constituent of the metal oxide layer comprises a diffusion metal constituent of the metal silicide layer diffused into the metal oxide layer.

3. The device of claim 2, wherein the metal oxide layer comprises at least one of a titanium oxide layer, a tantalum oxide layer, a tungsten oxide layer and a zirconium oxide layer.

4. The device of claim 1, wherein the metal silicide layer comprises titanium and a metal silicide.

5. The device of claim 4,
wherein the metal silicide comprises cobalt silicide or nickel silicide, and
wherein the metal silicide layer comprises the titanium and the cobalt silicide or the nickel silicide.

6. The device of claim 1, further comprising a diode between the substrate and the metal silicide layer.

7. The device of claim 6, wherein the metal silicide layer contacts the diode.

8. The device of claim 7, wherein the metal silicide layer comprises an ohmic contact with the diode.

9. The device of claim 8, wherein the conductive region comprises a word line adjacent the diode.

10. The device of claim 1, wherein the metal oxide layer directly contacts the metal silicon nitride layer and the metal silicide layer.

11. A phase-change memory device, comprising:
a substrate;
a conductive region on the substrate;
a lower electrode on the conductive region, the lower electrode comprising:
   a metal silicide layer on the conductive region;
   a metal silicon nitride layer comprising a resistivity of about 10 to about 100 times that of the metal silicide layer; and
   a metal oxide layer between and directly contacting the metal silicon nitride layer and the metal silicide layer, the metal oxide layer comprising a resistivity that is greater than that of the metal silicide layer and less than the resistivity of the metal silicon nitride layer;
a phase-change layer on the lower electrode; and
an upper electrode on the phase-change layer.

12. The phase-change memory device of claim 11,
wherein the phase-change layer is between the lower electrode and the upper electrode, and
wherein the metal silicon nitride layer is between the metal oxide layer and the phase-change layer.

13. The phase-change memory device of claim 12,
wherein the metal silicide layer comprises titanium and a metal silicide, and
wherein the metal oxide layer directly contacts the metal silicide layer that comprises the titanium and the metal silicide.

* * * * *